(12) United States Patent
Lee et al.

(10) Patent No.: US 10,908,212 B2
(45) Date of Patent: Feb. 2, 2021

(54) SEMICONDUCTOR MEMORY DEVICE INCLUDING A SHIFT REGISTER

(71) Applicant: SAMSUNG ELECTRONICS CO., LTD., Suwon-si (KR)

(72) Inventors: Hyunui Lee, Pyeongtaek-si (KR); Hye-Seung Yu, Goyang-si (KR); Won-Joo Yun, Yongin-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 168 days.

(21) Appl. No.: 16/169,107

(22) Filed: Oct. 24, 2018

(65) Prior Publication Data

US 2019/0271742 A1 Sep. 5, 2019

(30) Foreign Application Priority Data

Mar. 5, 2018 (KR) .................. 10-2018-0025758

(51) Int. Cl.
| | |
|---|---|
| *G01R 31/00* | (2006.01) |
| *G01R 31/317* | (2006.01) |
| *G11C 29/02* | (2006.01) |
| *G01R 31/3177* | (2006.01) |

(52) U.S. Cl.
CPC ... *G01R 31/31716* (2013.01); *G01R 31/3177* (2013.01); *G01R 31/31725* (2013.01); *G11C 29/02* (2013.01)

(58) Field of Classification Search
CPC ........ G01R 31/31716; G01R 31/31725; G01R 31/3177; G11C 29/02
See application file for complete search history.

(56) References Cited

U.S. PATENT DOCUMENTS

| | | | |
|---|---|---|---|
| 6,397,361 B1 | 5/2002 | Saitoh | |
| 6,445,001 B2* | 9/2002 | Yoshida | H01L 22/32 257/48 |
| 6,872,992 B2* | 3/2005 | Muramatsu | H01L 27/14893 257/228 |
| 7,007,215 B2* | 2/2006 | Kinoshita | G01R 31/31857 714/718 |
| 7,098,682 B2 | 8/2006 | Sasaki | |
| 7,123,456 B2 | 10/2006 | Kamata et al. | |
| 7,398,444 B2 | 7/2008 | Brox et al. | |

(Continued)

FOREIGN PATENT DOCUMENTS

| | | |
|---|---|---|
| JP | 2000-183739 | 6/2000 |
| KR | 10-2003-0020124 | 3/2003 |

(Continued)

OTHER PUBLICATIONS

JEDEC Standard, "High Bandwidth Memory (HBM) DRAM", JEDEC Solid State Technology Association, JESD235B (Revision of JESD235A), Nov. 2015, pp. 1-168.

*Primary Examiner* — Esaw T Abraham
(74) *Attorney, Agent, or Firm* — F. Chau & Associates, LLC

(57) ABSTRACT

A semiconductor memory device includes first bumps positioned along a first direction; second bumps positioned in parallel to the first bumps along the first direction; first registers connected with the first bumps; and second registers connected with the second bumps. The first registers and the second registers are sequentially connected and form a shift register.

19 Claims, 13 Drawing Sheets

(56) References Cited

U.S. PATENT DOCUMENTS

| | | |
|---|---|---|
| 7,586,955 B2 | 9/2009 | Iizuka |
| 7,626,411 B2 * | 12/2009 | Shimizume ...... G01R 31/31855 |
| | | 257/777 |
| 7,716,411 B2 | 5/2010 | Panabaker et al. |
| 7,800,416 B2 | 9/2010 | Kim et al. |
| 8,365,029 B2 * | 1/2013 | von Wendorff .............................. |
| | | G01R 31/31853 |
| | | 714/726 |
| 8,692,176 B2 * | 4/2014 | Kelly ................... G06F 21/602 |
| | | 250/208.1 |
| 8,843,794 B2 | 9/2014 | Nelson et al. |
| 9,043,662 B2 | 5/2015 | Selking |
| 9,343,418 B2 * | 5/2016 | Lowney ................. H01L 24/14 |
| 10,359,470 B2 * | 7/2019 | Anzou ............. G01R 31/31724 |
| 10,365,325 B2 * | 7/2019 | Dono ..................... G11C 29/36 |
| 2005/0180206 A1 | 8/2005 | Randell et al. |
| 2012/0239995 A1 * | 9/2012 | Gizdarski ........ G01R 31/31833 |
| | | 714/729 |
| 2016/0065334 A1 | 3/2016 | Warwick et al. |
| 2016/0216319 A1 | 7/2016 | Na et al. |
| 2017/0031656 A1 | 2/2017 | Mukhopadhyay et al. |

FOREIGN PATENT DOCUMENTS

| | | |
|---|---|---|
| KR | 10-0771544 | 10/2007 |
| KR | 10-0896462 | 5/2009 |
| KR | 10-2010-0030226 | 3/2010 |
| KR | 101027673 | 4/2011 |

* cited by examiner

FIG. 10
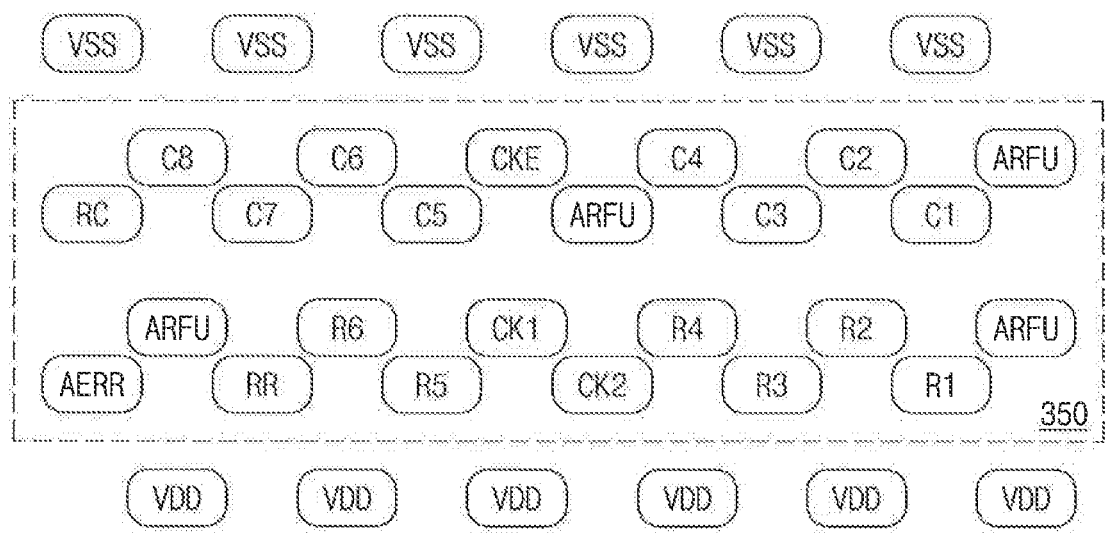
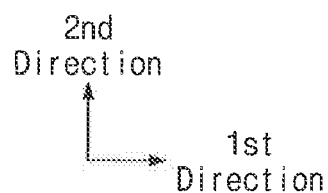

SEMICONDUCTOR MEMORY DEVICE INCLUDING A SHIFT REGISTER

CROSS-REFERENCE TO RELATED APPLICATION

This application claims priority under 35 U.S.C. § 119 to Korean Patent Application No. 10-2018-0025758 filed on Mar. 5, 2018, in the Korean Intellectual Property Office, the disclosure of which is incorporated by reference herein in its entirety.

TECHNICAL FIELD

Exemplary embodiments of the present inventive concept relate to a semiconductor device, and more particularly, to a semiconductor memory device.

DISCUSSION OF THE RELATED ART

As semiconductor memory technology further develops, the high speed, high integration, and low power of semiconductor memory devices further increase. The high speed, high integration, and low power of semiconductor memory devices may cause unintended malfunctions for conventional semiconductor memory devices. For example, the high speed, high integration, and low power of the semiconductor memory devices may hinder internal voltages of the semiconductor memory devices from reaching target levels.

The high speed of the semiconductor memory devices may result in a next cycle of a clock signal starting before the internal voltages varying in synchronization with the clock signal reach their target levels. The high integration of the semiconductor memory devices may result in the internal voltages not reaching their target levels due to the spaces (or intervals) between internal wirings of the semiconductor memory devices becoming narrower.

The low power of the semiconductor memory devices may impact the ability to drive the internal voltages to the target levels, which may result in the internal voltages not reaching their target levels.

SUMMARY

According to an exemplary of the present inventive concept, a semiconductor memory device includes first bumps positioned along a first direction; second bumps positioned in parallel to the first bumps along the first direction; first registers connected with the first bumps; and second registers connected with the second bumps. The first registers and the second registers are sequentially connected and form a shift register.

According to an exemplary of the present inventive concept, a semiconductor memory device includes first bumps positioned along a first direction; second bumps positioned in parallel to the first bumps along the first direction; first registers connected with the first bumps; and second registers connected with the second bumps. An output of a certain register of the first registers and the second registers is connected with an input of one of a first register of the first registers and a second register. The first register is the closest to the certain register, from among the first registers, and the second register is the closest to the certain register, from among the second registers. The first registers and the second registers form a shift register.

According to an exemplary of the present inventive concept, a semiconductor memory device includes first bumps positioned along a first direction; second bumps positioned in parallel to the first bumps along the first direction; third bumps positioned in parallel to the second bumps along the first direction; fourth bumps positioned in parallel to the third bumps along the first direction; first registers connected with the first bumps; second registers connected with the second bumps; third registers connected with the third bumps; and fourth registers connected with the fourth bumps. An output of a certain register from among each of the first registers, the second registers, the third registers, and the fourth registers is connected with an input of one of a first register of the first registers, a second register of the second registers, a third register of the third registers, and a fourth register of the fourth registers. The first register is the closest to the certain register, from among the first registers. The second register is the closest to the certain register, from among the second registers. The third register is the closest to the certain register, from among the third registers. The fourth register is the closest to the certain register, from among the fourth registers. The first registers, the second registers, the third registers, and the fourth registers form a shift register.

According to an exemplary of the present inventive concept, a semiconductor memory device includes a first row of first bumps arranged along a first direction; a second row of second bumps arranged in parallel to the first row along the first direction; first registers connected with the first bumps; and second registers connected with the second bumps. The first registers and the second registers are connected to each other. An output of a first-first register is connected with an input of one of the second registers. The first-first register is positioned at a last position, in the first direction, from among the first registers, and the second register is positioned at a first position, in the first direction, from among the second registers.

BRIEF DESCRIPTION OF THE DRAWINGS

The above and other features of the inventive concept will become apparent by describing in detail exemplary embodiments thereof with reference to the accompanying drawings, in which:

FIG. 10 is a diagram illustrating an arrangement of bumps associated with an address word of a first channel according to an exemplary embodiment of the present inventive concept;

DETAILED DESCRIPTION OF THE EMBODIMENTS

Exemplary embodiments of the present inventive concept will be described in more detail below with reference to the accompanying drawings.

Figure 1:
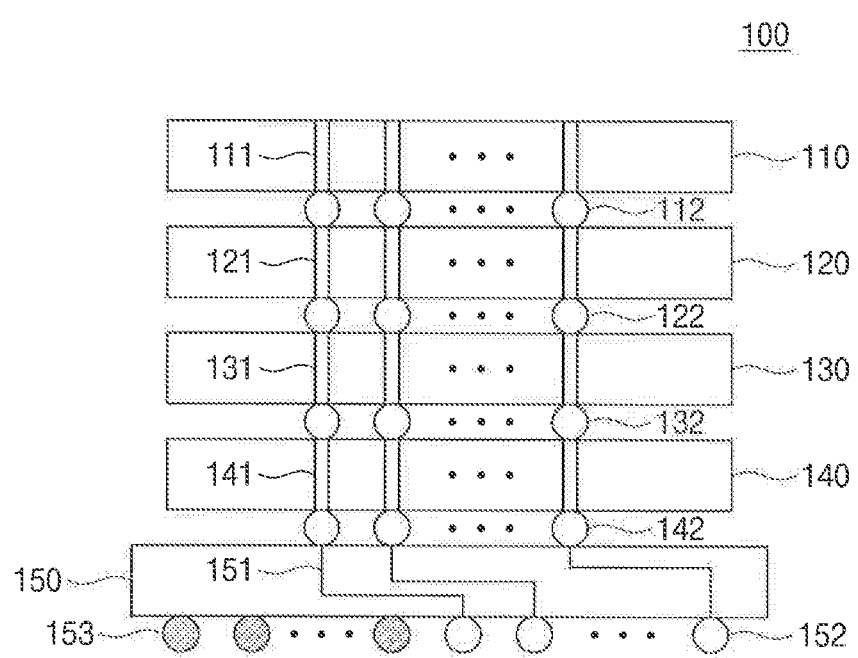
FIG. 1 is a diagram illustrating a semiconductor memory system according to an exemplary embodiment of the present inventive concept.

FIG. 1 is a diagram illustrating a semiconductor memory system 100 according to an exemplary embodiment of the present inventive concept. Referring to FIG. 1, the semiconductor memory system 100 includes first to fourth semiconductor memory devices 110 to 140 and a semiconductor logic device 150. The first semiconductor memory device 110 includes first bumps 112. The first bumps 112 may be connected with internal components of the first semiconductor memory device 110 through first through silicon vias 111. For example, the first through silicon vias 111 may penetrate the first memory device 110.

The second semiconductor memory device 120 includes second bumps 122. The second bumps 122 may be connected with internal components of the second semiconductor memory device 120 through second through silicon vias 121. The second through silicon vias 121 may be connected with the first bumps 112 of the first semiconductor memory device 110.

The third semiconductor memory device 130 includes third bumps 132. The third bumps 132 may be connected with internal components of the third semiconductor memory device 130 through third through silicon vias 131. The third through silicon vias 131 may be connected with the second bumps 122 of the second semiconductor memory device 120.

The fourth semiconductor memory device 140 includes fourth bumps 142. The fourth bumps 142 may be connected with internal components of the fourth semiconductor memory device 140 through fourth through silicon vias 141. The fourth through silicon vias 141 may be connected with the third bumps 132 of the third semiconductor memory device 130.

The first to fourth semiconductor memory devices 110 to 140 may be stacked on the semiconductor logic device 150. The semiconductor logic device 150 includes internal wirings (or interconnections) 151, fifth bumps 152, and sixth bumps 153. The internal wirings 151 may be connected with the fourth bumps 142 of the fourth semiconductor memory device 140. The internal wirings 151 may connect the fourth bumps 142 and the fifth bumps 152.

In other words, the first to fourth semiconductor memory devices 110 to 140 stacked on the semiconductor logic device 150 may be accessed through the fifth bumps 152. The sixth bumps 153 may be connected with components of the semiconductor logic device 150. In other words, components of the semiconductor logic device 150 may be accessed through the sixth bumps 153.

For example, the components of the semiconductor logic device 150 may perform various logical operations by using data stored in the first to fourth semiconductor memory devices 110 to 140. For example, the semiconductor logic device 150 may perform data search, data processing, etc. The logical operations of the semiconductor logic device 150 may be requested through the sixth bumps 153, and a result of the logical operations may be output through the sixth bumps 153.

In an exemplary embodiment of the present inventive concept, the first to fourth semiconductor memory devices 110 to 140 and the semiconductor logic device 150 may be semiconductor dies. The first to fourth semiconductor memory devices 110 to 140 and the semiconductor logic device 150 may be assembled in one package.

In an exemplary embodiment of the present inventive concept, the semiconductor logic device 150 may be optional in the semiconductor memory system 100. Except for the semiconductor logic device 150, the first to fourth semiconductor memory devices 110 to 140 may constitute the semiconductor memory system 100 and may be assembled in one package.

Figure 2:
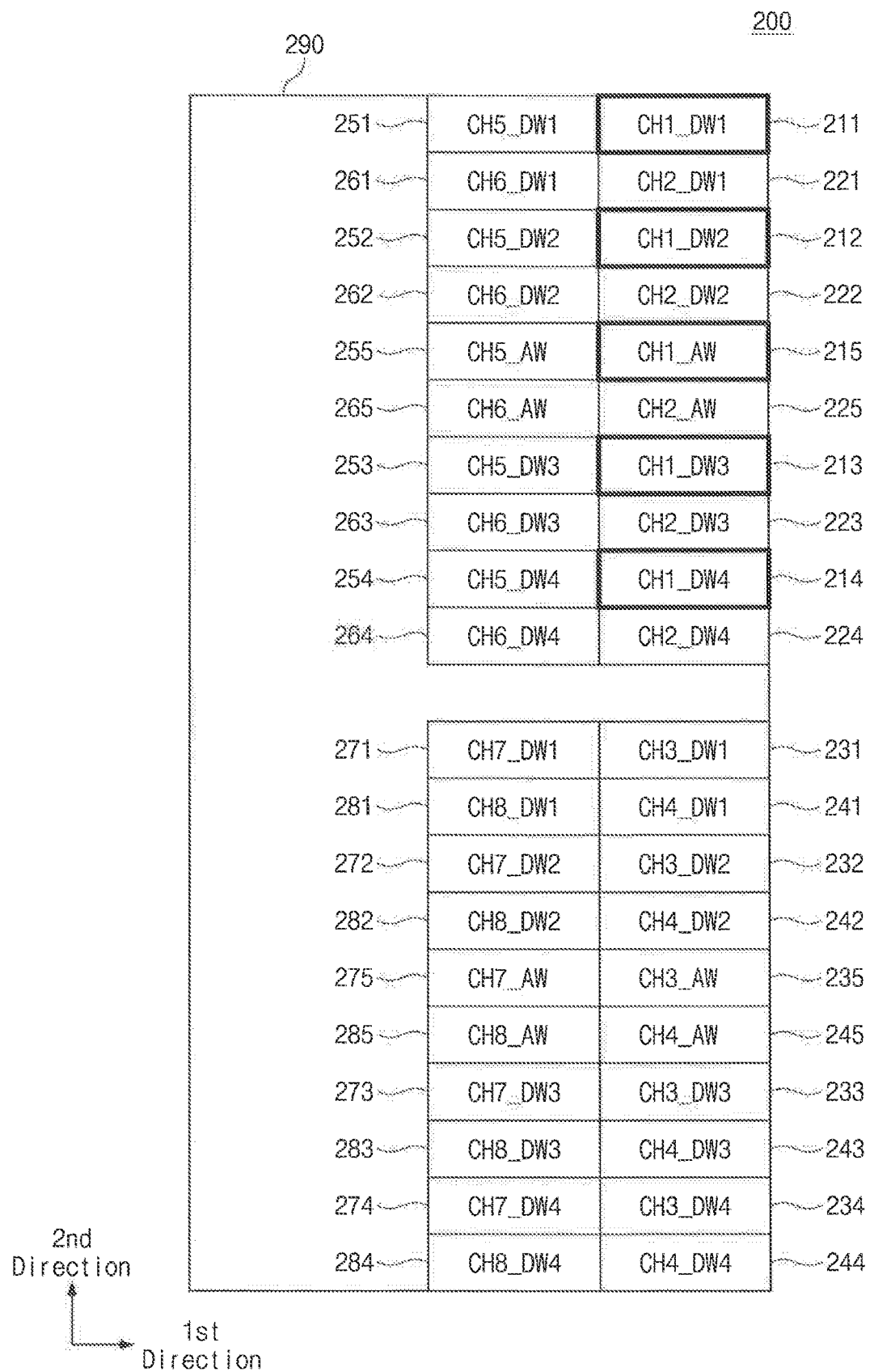
FIG. 2 is a diagram illustrating a layout of bumps of first to fourth semiconductor memory device according to an exemplary embodiment of the present inventive concept.

FIG. 2 is a diagram illustrating a layout of the bumps 112, 122, 132, or 142 of the first, second, third, or fourth semiconductor memory device 110, 120, 130, or 140. In an exemplary embodiment of the present inventive concept, a ball-out diagram in compliance with the standard of a high bandwidth memory (HEM) is illustrated in FIG. 2.

Referring to FIGS. 1 and 2, the bumps 112, 122, 132, or 142 may be divided into two or more channels. With regard to a first channel, first to fourth data words (CH1_DW1 to CH1_DW4) 211 to 214 and an address word (CH1_AW) 215 may be arranged as illustrated in FIG. 2.

With regard to a second channel, first to fourth data words (CH2_DW1 to CH2_DW4) 221 to 224 and an address word (CH2_AW) 225 may be arranged as illustrated in FIG. 2. With regard to a third channel, first to fourth data words (CH3_DW1 to CH3_DW4) 231 to 234 and an address word (CH3_AW) 235 may be arranged as illustrated in FIG. 2.

With regard to a fourth channel, first to fourth data words (CH4_DW1 to CH4_DW4) 241 to 244 and an address word (CH4_AW) 245 may be arranged as illustrated in FIG. 2. With regard to a fifth channel, first to fourth data words (CH5_DW1 to CH5_DW4) 251 to 254 and an address word (CH5_AW) 255 may be arranged as illustrated in FIG. 2.

With regard to a sixth channel, first to fourth data words (CH6_DW1 to CH6_DW4) 261 to 264 and an address word (CH4_AW) 265 may be arranged as illustrated in FIG. 2. With regard to a seventh channel, first to fourth data words (CH7_DW1 to CH7_DW4) 271 to 274 and an address word (CH7_AW) 275 may be arranged as illustrated in FIG. 2. With regard to an eighth channel, first to fourth data words (CH8_DW1 to CH8_DW4) 281 to 284 and an address word (CH8_AW) 285 may be arranged as illustrated in FIG. 2.

In addition to the purpose of communicating with the semiconductor memory device 110, 120, 130, or 140, additional bumps 290 for an addition function such as test or power supply may be arranged as illustrated in FIG. 2. For example, the additional bumps 290 may be positioned on the first, second, third, or fourth semiconductor memory device 110, 120, 130, or 140.

The layout diagram 200 of FIG. 2 shows physical positions where the bumps 112, 122, 132, or 142 are positioned. For example, when viewed from above a bottom surface of the semiconductor memory device 110, 120, 130, or 140, the layout diagram 200 indicates positions on a coordinate system where the bumps are positioned, in consideration of a two-dimensional (e.g., also called rectangular or orthogonal) coordinate system formed by a first direction and a second direction.

In the first to eighth channels, bumps for data words and bumps for an address word may be substantially identically arranged. Accordingly, as marked by a bold line, the first to fourth data words 211 to 214 and the address word 215 associated with the first channel will be only described below.

Figure 3:
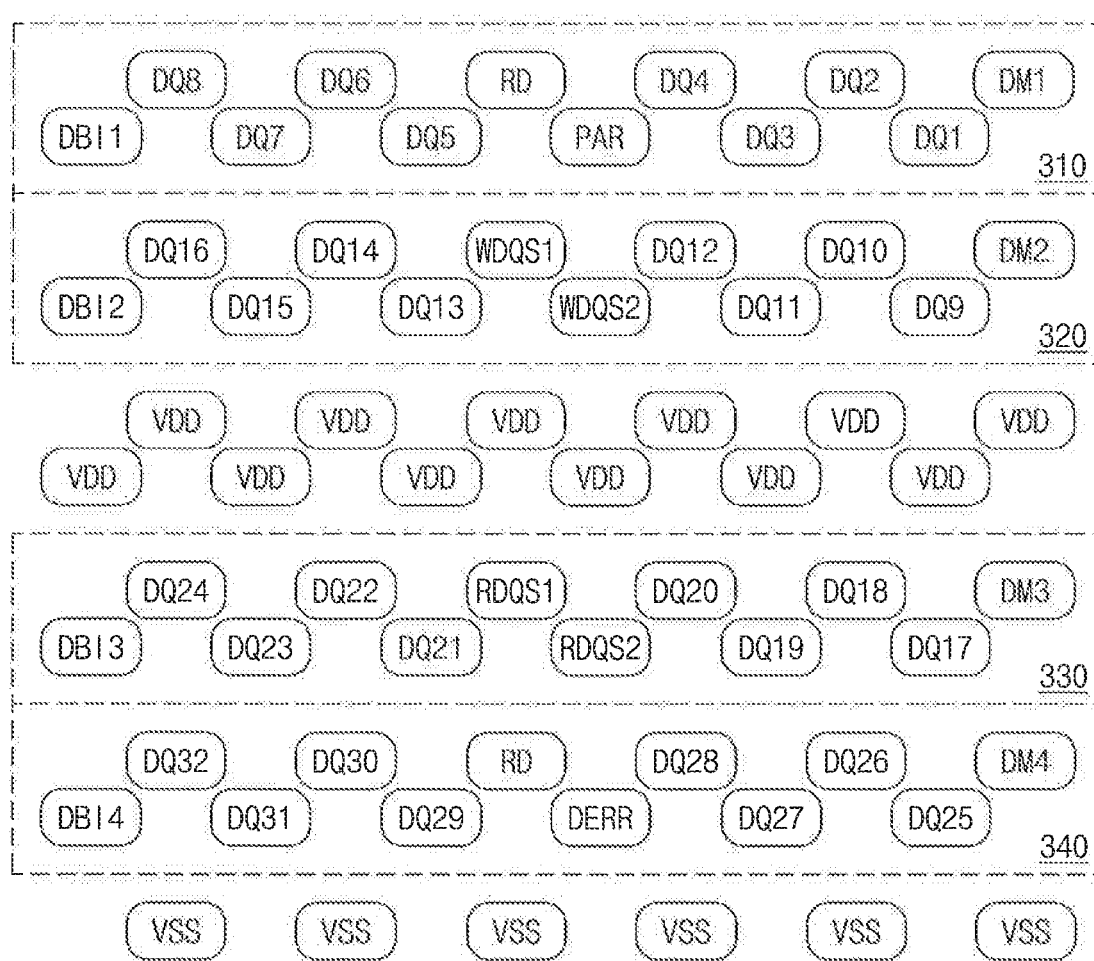
FIG. 3 is a diagram illustrating an arrangement of bumps associated with a first data word of a first channel according to an exemplary embodiment of the present inventive concept.

FIG. 3 is a diagram illustrating an arrangement of bumps associated with the first data word (CH1_DW1) 211 of a first channel are arranged according to an exemplary embodiment of the present inventive concept. Referring to FIG. 3, bumps of the first data word (CH1_DW1) 211 of the first channel may include first to fourth groups 310 to 340, power bumps VDD, and ground bumps VSS.

The first group 310 may include a first row of bumps and a second row of humps. The bumps in the first row of the first group 310 include an 8th data bump DQ8, a 6th data bump DQ6, a redundant data bump RD, a 4th data bump DQ4, a 2nd data bump DQ2, and a 1st data mask bump DM1 arranged along the first direction.

The bumps in the second row of the first group 310 include a 1st data byte inversion bump DBI1, a 7th data bump DQ7, a 5th data bump DQ5, a parity bump PAR, a 3rd data bump DQ3, and a 1st data bump DQ1.

The 1st to 8th data bumps DQ1 to DQ8 may be used to convey (e.g., output or input) data signals. The redundant data bump RD may be used to convey a redundant data signal. The 1st data mask bump DM1 may be used to convey a data mask signal associated with the data bumps DQ1 to DQ8 of the first group 310 to which the 1st data mask bump DM1 is included.

The 1st data byte inversion bump DBI1 may be used to convey a data byte inversion signal associated with the data bumps DQ1 to DQ8 of the first group 310 to which the 1st data byte inversion bump DM1 is included. The parity bump PAR may be used to convey a parity signal.

The bumps in the first row and the bumps in the second row of the first group 310 may be alternately arranged along the first direction. For example, the 1st data byte inversion bump DBI1 may be positioned in the second row, and the 8th data bump DQ8 may be positioned in the first row along the first direction.

For example, the 7th data bump DQ7 may be positioned in the second row, and the 6th data bump DQ6 may be positioned in the first row along the first direction. Likewise, the bumps of the first group 310 may be alternately arranged between the first row and the second row along the first direction.

As an additional example, the bumps in the first row of the first group 310 and the bumps in the second row of the first group 310 may be arranged such that the first row of bumps is misaligned with the second row of bumps.

Bumps of a second group 320 may include a first row of bumps and a second row of bumps. The bumps in the first row of the second group 320 include a 16th data bump DQ16, a 14th data bump DQ14, a 1st write data strobe bump WDQS1, a 12th data bump DQ12, a 10th data bump DQ10, and a 2nd data mask bump DM2.

The bumps in the second row of the second group 320 include a 2nd data byte inversion bump DBI2, a 15th data bump DQ15, a 13th data bump DQ13, a 2nd write data strobe bump WDQS2, a 11th data bump DQ11, and a 9th data bump DQ9.

The 9th to 16th data bumps DQ9 to DQ16, the 2nd data mask bump DM2 and the 2nd data byte inversion bump DBI2 may have similar functions to those of the 1st to 8th data bumps DQ1 to DQ8, the 1st data mask bump DM1, and the 1st data byte inversion bump DBI1 of the first group 310.

The 1st and 2nd write data strobe bumps WDQS1 to WDQS2 may be used to convey first and second write data strobe signals which are complementary. As described with reference to the first group 310, in the second group 320, the bumps may be alternately arranged in the first row and the second row along the first direction. For example, the first row of bumps in the second group 320 may be misaligned with the second row of bumps in the second group 320.

Bumps of a third group 330 may include a first row of bumps and a second row of bumps. The humps in the first row of the third group 330 include a 24th data bump DQ24, a 22nd data bump DQ22, a 1st read data strobe bump RDQS1, a 20th data bump DQ20, a 18th data bump DQ18, and a 3rd data mask bump DM3.

The bumps in the second row of the third group 330 include a 3rd data byte inversion bump DBI3, a 23rd data bump DQ23, a 21st data bump DQ21, a 2nd read data strobe bump RDQS2, a 19th data bump DQ19, and a 17th data bump DQ17.

The 17th to 24th data bumps DQ17 to DQ24, the 3rd data mask bump DM3, and the 3rd data byte inversion bump DBI3 may have similar functions to those of the 1st to 8th data bumps DQ1 to DQ8, the 1st data mask bump DM1, and the 1st data byte inversion bump DBI1 of the first group 310.

The 1st and 2nd read data strobe bumps RDQS1 to RDQS2 may be used to convey first and second read data strobe signals which are complementary. As described with reference to the first group 310, in the third group 330, the bumps may be alternately arranged in the first row and the second row along the first direction. For example, the first row of bumps in the third group 330 may be misaligned with the second row of bumps in the third group 330.

Bumps of a fourth group 340 may include a first row of bumps and a second row of bumps. The bumps in the first row of the fourth group 340 include a 32nd data bump DQ32, a 30th data bump DQ30, a redundant data bump RD, a 28th data bump DQ28, a 26th data bump DQ26, and a 4th data mask bump DM4.

The bumps in the second row of the fourth group 340 include a 4th data byte inversion bump DBI4, a 31st data bump DQ31, a 29th data bump DQ29, a data error bump DERR, a 27th data bump DQ27, and a 25th data bump DQ25.

The 25th to 32th data bumps DQ25 to DQ32, the 4th data mask bump DM4, the 4th data byte inversion bump DBI4, and the redundant data bump RD may have similar functions to those of the 1st to 8th data bumps DQ1 to DQ8, the 1st data mask bump DM1, the 1st data byte inversion bump DBI1, and the redundant data bump RD of the first group 310.

The data error bump DERR may be used to convey a data error signal indicating that an error has occurred in the data. As described with reference to the first group 310, in the fourth group 340, the bumps may be alternately arranged in the first row and the second row along the first direction. For example, the first row of bumps in the fourth group 340 may be misaligned with the second row of bumps in the fourth group 340.

FIG. 3 is a diagram illustrating physical positions at which humps are positioned. For example, positions of bumps illustrated in FIG. 3 indicate positions on a coordinate system, at which the bumps are positioned, in consideration of a two-dimensional (e.g., also called rectangular or orthogonal) coordinate system provided by the first direction and the second direction, when viewed from a position of the first data word (CH1_DW1) 211 in the first channel.

The arrangement of bumps of the second to fourth data words (CH1_DW2 to CH1_DW4) 212 to 214 in the first channel is substantially identical to the arrangement of bumps illustrated in FIG. 3 except the number of the bumps is changed. For example, bumps of each of the second to fourth data words (CH1_DW2 to CH1_DW4) 212 to 214 may be divided into first to fourth groups. In addition, since bumps of respective channels are identically arranged, bumps of any data word in any channel may be divided into first to fourth groups.

Figure 4:
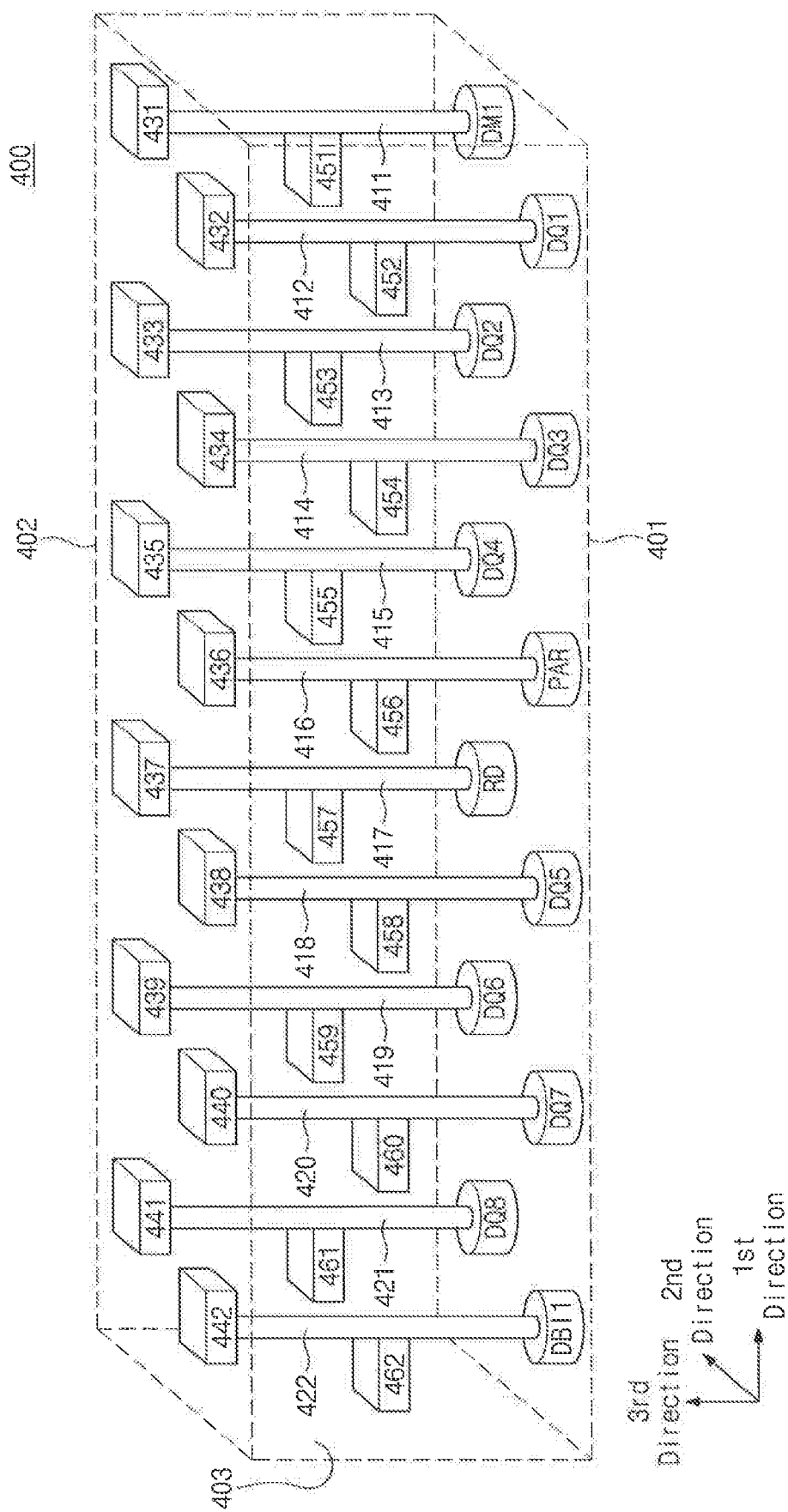
FIG. 4 is a diagram illustrating bumps of a first data word of a first channel implemented in a semiconductor memory device according to an exemplary embodiment of the present inventive concept.

FIG. 4 is a diagram illustrating bumps of the first data word (CH1_DW1) 211 of the first channel implemented in the semiconductor memory device 400 according to an exemplary embodiment of the present inventive concept. For example, the semiconductor memory device 400 may be a portion of one of the first to fourth semiconductor memory devices 110 to 140 of FIG. 1.

Referring to FIG. 4, the 1st data mask bump DM1, the 1st to 4th data bumps DQ1 to DQ4, the parity bump PAR, the redundant data bump RD, the 5th to 8th data bumps DQ5 to DQ8, and the 1st data byte inversion bump DBI1 may be positioned on a bottom surface 401 of the semiconductor memory device 400.

As described with reference to FIG. 3, the bumps DQ8, DQ6, RD, DQ4, DQ2, and DM1 in the first row and the bumps DBI1, DQ7, DQ5, PAR, DQ3, and DQ1 in the second row may be alternately arranged along the first direction.

The bumps DM1, DQ1 to DQ4, PAR, RD, DQ5 to DQ8, and DBI1 may be respectively connected with through silicon vias 411 to 422 which extend in the interior 403 of the semiconductor memory device 400 along a third direction.

The through silicon vias 411, 413, 415, 417, 419, and 421 connected with the bumps DQ8, DQ6, RD, DQ4, DQ2, and DM1 in the first row and the through silicon vias 412, 414, 416, 418, 410, and 422 connected with the bumps DBI1, DQ7, DQ5, PAR, DQ3, and DQ1 in the second row may be alternately arranged along the first direction. For example, the through silicon vias 411, 413, 415, 417, 419, and 421 in the first row are misaligned with the through silicon vias 412, 414, 416, 418, 410, and 422 in the second row.

The through silicon vias 411 to 422 may be respectively connected with pads 431 to 442 on a top surface 402 of the semiconductor memory device 400. For example, bumps of another (e.g., a second) semiconductor memory device may be connected with the pads 431 to 442. As an additional example, bumps of the second semiconductor memory device may be connected with the pads 431 to 442 by being disposed on the pads 431 to 442.

The pads 431, 433, 435, 437, 439, and 441 connected with the bumps DQ8, DQ6, RD, DQ4, DQ2, and DM1 in the first row and the pads 432, 434, 436, 438, 440, and 442 connected with the bumps DBI1, DQ7, DQ5, PAR, DQ3, and DQ1 in the second row may be alternately arranged along the first direction. For example, the arrangement of the pads 431, 433, 435, 437, 439, and 441 in the first row may correspond to that of the bumps DQ8, DQ6, RD, DQ4, DQ2, and DM1 in the first row, and the arrangement of the pads 432, 434, 436, 438, 440, and 442 in the second row may correspond to that of the bumps DBI1, DQ7, DQ5, PAR, DQ3, and DQ1 in the second row.

Input/output blocks 451 to 462 connected with the through silicon vias 411 to 422 may be disposed in the interior 403 of the semiconductor memory device 400. The input/output blocks 451 to 462 may receive signals from the bumps DM1, DQ1 to DQ4, PAR, RD, DQ5 to DQ8, and DBI1 and may amplify the received signals. In addition, the input/output blocks 451 to 462 may amplify internal signals and may output the amplified signals through the bumps DM1, DQ1 to DQ4, PAR, RD, DQ5 to DQ8, and DBI1.

To prevent signals exchanged through the bumps DM1, DQ1 to DQ4, PAR, RD, DQ5 to DQ8, and DBI1 from being attenuated by a load, the input/output blocks 451 to 462 may be positioned adjacent to the through silicon vias 411 to 422 in the interior 403 of the semiconductor memory device 400. For example, positions of the input/output blocks 451 to 462 may be substantially identical or similar to positions of the bumps DM1, DQ1 to DQ4, PAR, RD, DQ5 to DQ8, and DBI1.

When a power is supplied to the semiconductor memory device 400, the semiconductor memory device 400 may perform training with an external device. The training may include transmitting data having a specific pattern and adjusting transmission timings depending on a result of the transmission.

The data bumps DQ1 to DQ32, the data mask bumps DM1 to DM4, and the data byte inversion bumps DBI1 to DBI4 of the bumps of the first data word in the first channel may be targeted for the training. For example, in the first to fourth groups 310 to 340, bumps of the same position may be targeted for the training.

To receive or output data having a particular pattern in the training, the semiconductor memory device 400 may include a loopback chain. For example, in the bumps of the first data word (CH1_DW1) 211 in the first channel described with reference to FIG. 3, the loopback chain may be provided with respect to each of the first to fourth groups 310 to 340. Likewise, in bumps of any data word in any channel, the loopback chain may be provided with respect to each of first to fourth groups.

For example, each of the input/output blocks 451 to 455 and 456 to 462 targeted for the training may include at least one register. The registers of the input/output blocks 451 to 455 and 456 to 462 targeted for the training may form the loopback chain. The loopback chain may be organized into a linear feedback shift register (LFSR) or a multiple input shift register MISR).

The linear feedback shift register may generate a pseudo random pattern for an output. The multiple input shift register may store and process an input pattern.

Figure 5:
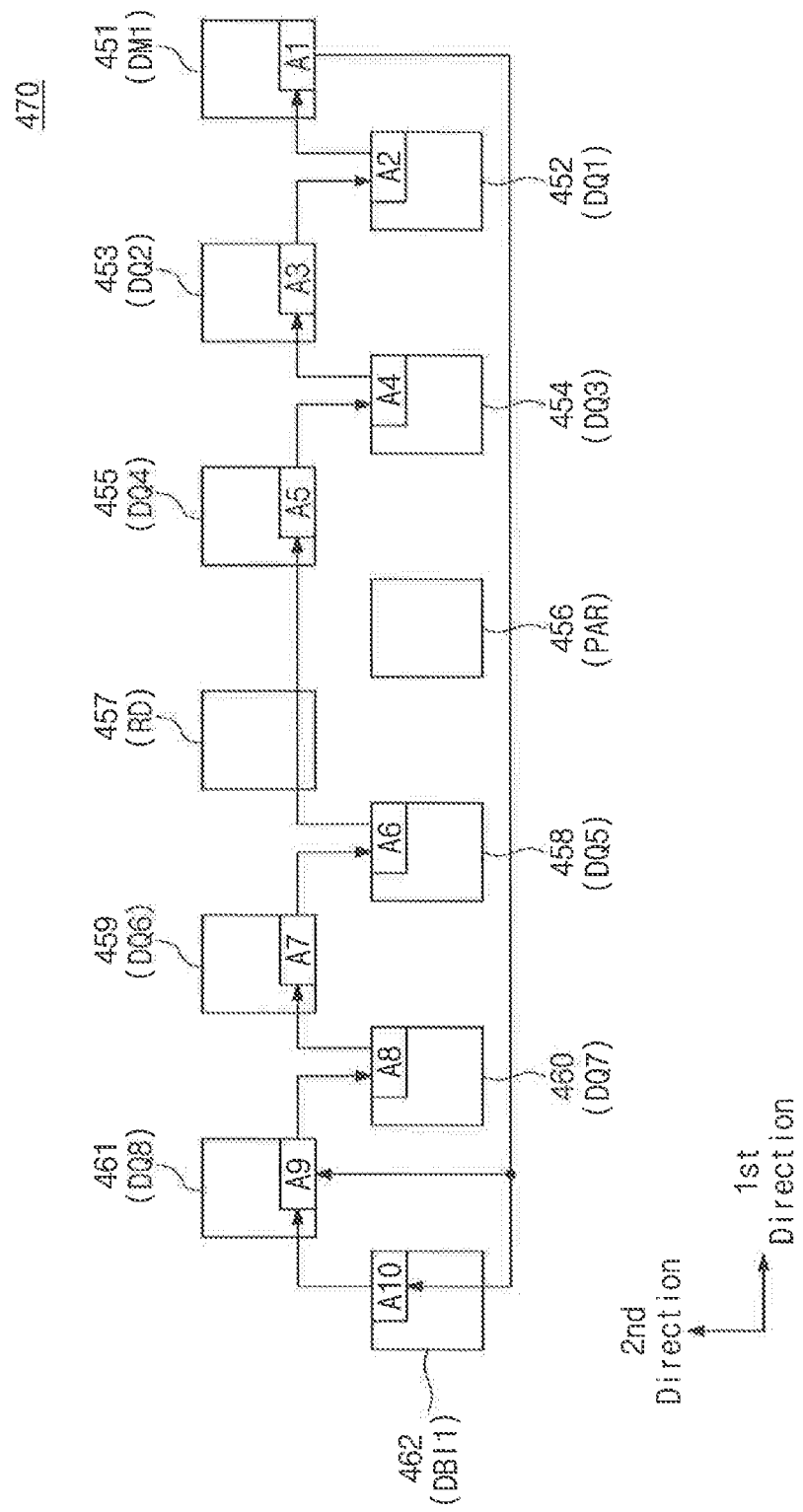
FIG. 5 is a diagram illustrating input/output blocks, associated with bumps of a first group of a first data word in a first channel, forming a loopback chain according to an exemplary embodiment of the present inventive concept.

FIG. 5 is a diagram illustrating input/output blocks 451 to 462, associated with the bumps DM1, DQ1 to DQ4, PAR, RD, DQ5 to DQ8, and DBI1 of the first group 310 of the first data word (CH1_DW1) 211 in the first channel, forming a loopback chain 470 according to an exemplary embodiment of the present inventive concept.

Referring to FIG. 5, the input/output blocks 451, 453, 455, 457, 459, and 461 in the first row and the input/output blocks 452, 454, 456, 458, 460, and 462 in the second row may be alternately arranged along the first direction. For example, the first row of input/output blocks 451, 453, 455, 457, 459, and 461 may be misaligned with the second row of input/output blocks 452, 454, 456, 458, 460, and 462.

The input/output block 456 corresponding to the parity bump PAR and the input/output block 457 corresponding to the redundant data bump RD may not be targeted for training. Accordingly, the input/output blocks 456 and 457 may not include a register for forming a loopback chain.

The input/output blocks 451, 452, 453, 454, 455, 458, 459, 460, 461 and 462 respectively corresponding to the bumps DM1, DQ1, DQ2, DQ3, DQ4, DQ5, DQ6, DQ7, DQ8, and DBI1 may respectively include first to tenth registers A1 to A10.

The first to tenth registers A1 to A10 may be sequentially connected and may constitute the loopback chain. For example, an output of the first register A1 may be connected with an input of the tenth register A10 and an input of the ninth register A9. An output of the tenth register A10 may be connected with an input of the ninth register A9.

An output of the ninth register A9 may be connected with an input of the eighth register A8, and an output of the eighth register A8 may be connected with an input of the seventh register A7. An output of the seventh register A7 may be connected with an input of the sixth register A6, and an output of the sixth register A6 may be connected with an input of the fifth register A5.

An output of the fifth register A5 may be connected with an input of the fourth register A4, and an output of the fourth register A4 may be connected with an input of the third register A3. An output of the third register A3 may be connected with an input of the second register A2, and an output of the second register A2 may be connected with an input of the first register A1.

FIG. 5 shows positions at which the input/output blocks 451 to 462 are positioned. For example, in the interior 403 of the semiconductor memory device 400, actual positions at which the input/output blocks 451 to 462 are positioned may be illustrated in FIG. 5 in consideration of the coordinate system formed by the first direction and the second direction.

In a loopback chain 470 illustrated in FIG. 5, a length of a wiring from the first register A1 to the ninth register A9 or the tenth register A10 may be longer than lengths of the remaining wiring for forming the loopback chain 470. For example, the length of the wiring connecting the first register A1 to the tenth register A10 is longer than that of the wiring connecting second register A2 to the first register A1. Accordingly, the wiring from the first register A1 to the ninth register A9 or the tenth register A10 may be a critical path that may limit the performance of the loopback chain 470.

For example, the load of the critical path may increase as a length of the critical path increases. Accordingly, a longer time or a higher voltage may be required to adjust a voltage level of the critical path to a target level. In addition, as the length of the critical path increases, the coupling between the critical path and any other wirings adjacent to the critical path may increase. Accordingly, a longer time or a higher voltage may be required to adjust a voltage level of the critical path to a target level.

The performance (e.g., an operating speed, a necessary voltage, etc.) of the loopback chain 470 illustrated in FIG. 5 may be limited as the critical path exists.

Figure 6:
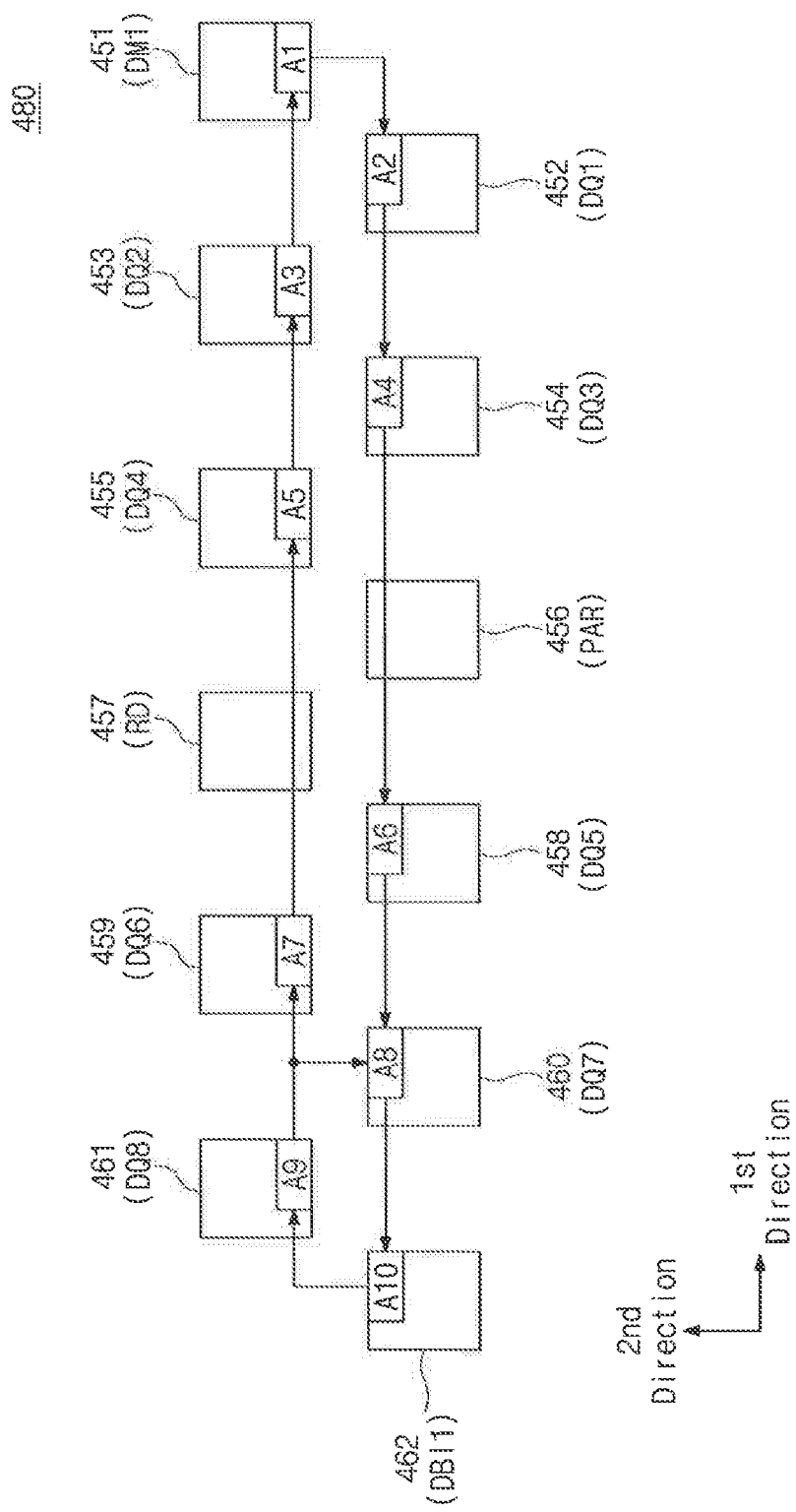
FIG. 6 is a diagram illustrating input/output blocks, associated with bumps of a first group of a first data word in a first channel, forming a loopback chain of a shape according to an exemplary embodiment of the present inventive concept.

FIG. 6 is a diagram illustrating the input/output blocks 451 to 462, associated with the bumps DM1, DQ1 to DQ4, PAR, RD, DQ5 to DQ8, and DBI1 of the first group 310 of the first data word (CH1_DW1) 211 in the first channel, forming a loopback chain 480 of shape according to an exemplary embodiment of the present inventive concept.

Referring to HG. 6, the input/output blocks 451, 453, 455, 457, 459, and 461 in the first row and the input/output blocks 452, 454, 456, 458, 460, and 462 in the second row may be alternately arranged along the first direction.

The input/output block 456 corresponding to the parity bump PAR and the input/output block 457 corresponding to the redundant data bump RD may not be targeted for training. Accordingly, the input/output blocks 456 and 457 may not include a register for forming the loopback chain 480.

The input/output blocks 451, 452, 453, 454, 455, 458, 459, 460, 461 and 462 respectively corresponding to the bumps DM1, DQ1, DQ2, DQ3, DQ4, DQ5, DQ6, DQ7, DQ8, and DBI1 may respectively include first to tenth registers A1 to A10.

An output of the first register A1 may be connected with an input of the second register A2, and an output of the second register A2 may be connected with an input of the fourth register A4. An output of the fourth register A4 may be connected with an input of the sixth register A6, and an output of the sixth register A6 may be connected with an input of the eighth register A8.

An output of the eighth register A8 may be connected with an input of the tenth register A10. An output of the tenth register A10 may be connected with an input of the ninth register A9.

An output of the ninth register A9 may be connected with an input of the seventh register A7 and an input of the eighth register A8, and an output of the seventh register A7 may be connected with an input of the fifth register A5. An output of the fifth register A5 may be connected with an input of the third register A3, and an output of the third register A3 may be connected with an input of the first register A1.

For example, the registers A1 to A10 may be sequentially connected to form the loopback chain 480. The loopback chain 480 may have a rectangular shape. For example, the registers A1, A3, A5, A7, and A9 in the first row may be sequentially connected along the first direction. The registers A2, A4, A6, A8, and A10 in the second row may be sequentially connected along a direction opposite to the first direction. In addition, the first row and second row may be connected to each other by the connection between the first register A1 and the second register A2 and the connection between the ninth register A9 and the tenth register A10.

An output of the first register A1, which is at the last position in the first direction, from among the registers A1, A3, A5, A7, and A9 in the first row may provide an input to an input of the second register A2, which is at the last position in the first direction, from among the registers A2, A4, A6, A8 and A10 in the second row.

An output of the tenth register A10, which is at the last position in the direction opposite to the first direction, from among the registers A2, A4, A6, A8, and A10 in the second row may provide an input to an input of the ninth register A9, which is at the last position in the direction opposite to the first direction, from among the registers A1, A3, A5, A7, and A9 in the first row.

An output of each of the registers A1 to A10 may be connected with at least one input of a register, which is the closest input to the output of each of the registers A1 to A10, from among the registers A1, A3, A5, A7, and A9 in the first row and from among the registers A2, A4, A6, A5, and A10 in the second row.

As illustrated in FIG. 6, in the case where the loopback chain 480 is formed, the loopback chain 480 may not include a wiring with a length that is longer than lengths of the remaining wirings. For example, the loopback chain 480 may not include a wiring with a critical path. Accordingly, the performance of the loopback chain 480 may be increased regardless of a wiring.

In the case where the loopback chain 480 is implemented as described with reference to FIG. 6, a pattern generated by the loopback chain 480 and a comparison result generated by the loopback chain 480 may be different from a pattern and a comparison result of the loopback chain 470 described with reference to FIG. 5. Accordingly, to apply the loopback chain 480 of FIG. 6, a training algorithm may be modified to apply a change of the pattern or the comparison result.

For another example, for the loopback chain 480 of FIG. 6 to generate the pattern or comparison result similar to that of the loopback chain 470 described with reference to FIG. 5, bumps and physical positions of input/output blocks associated with the bumps may be changed in the loopback chain 480 of FIG. 6.

For example, the input/output block 461 including the ninth register A9 may be modified to be associated with the first data mask bump DM1. The input/output block 462 including the tenth register A10 may be associated with the first data byte inversion bump DBI1.

The input/output block 460 including the eighth register A8 may be modified to be associated with the eighth data hump DQ8. The input/output block 458 including the sixth register A6 may be modified to be associated with the seventh data bump DQ7. The input/output block 454 including the fourth register A4 may be modified to be associated with the sixth data bump DQ6.

The input/output block 452 including the second register A2 may be modified to be associated with the fifth data bump DQ5. The input/output block 451 including the first register A1 may be modified to be associated with the fourth data bump DQ4. The input/output block 453 including the third register A3 may be modified to be associated with the third data bump DQ3.

The input/output block 455 including the fifth register A5 may be modified to be associated with the second data bump DQ2. The input/output block 459 including the seventh register A7 may be modified to be associated with the first data bump DQ1.

Through the modification of the loopback chain 480 described above, the pattern and the comparison result which the loopback chain 480 generates may be identical to the pattern and the comparison result which the loopback chain 470 of FIG. 5 generates.

Figure 7:
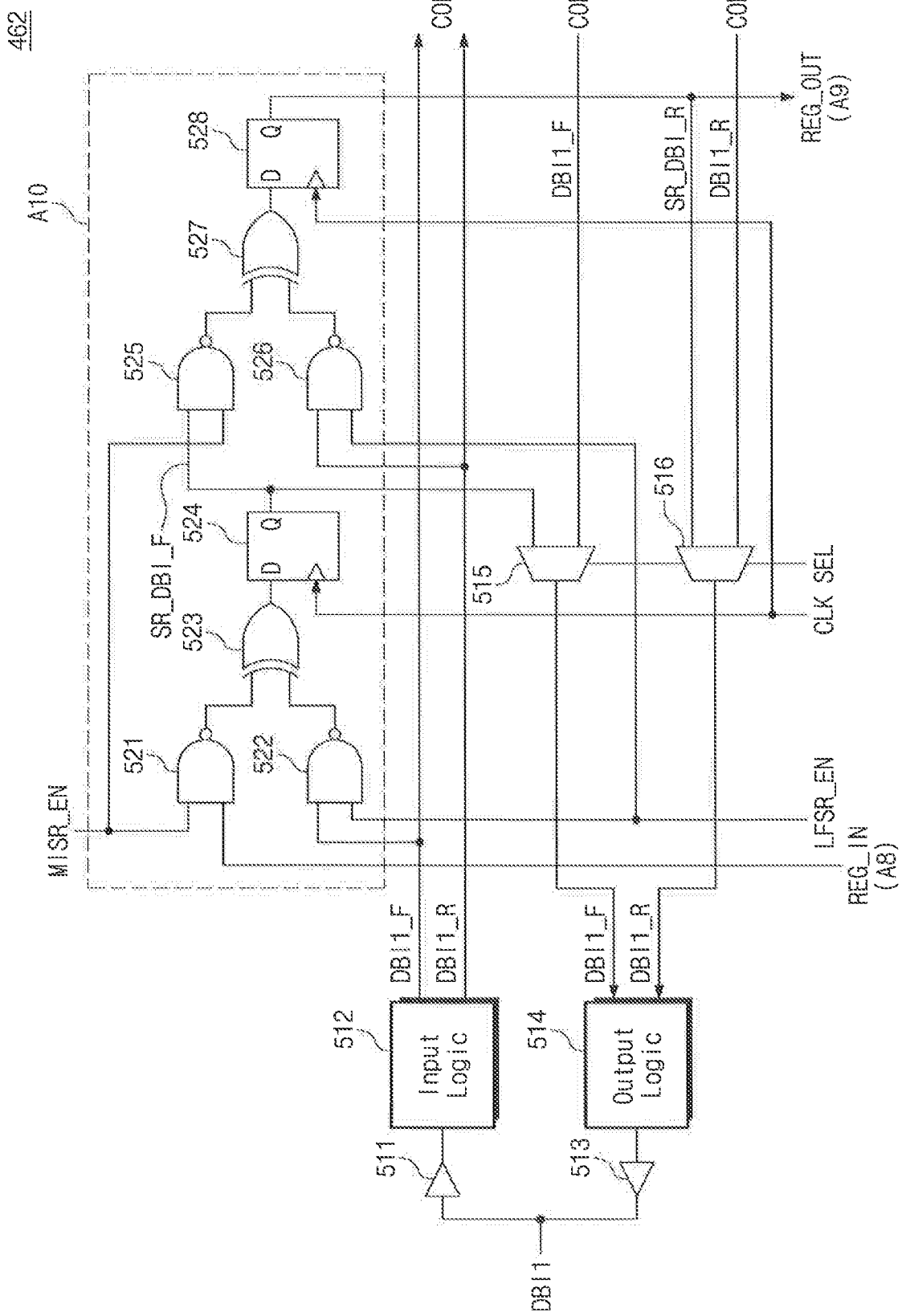
FIG. 7 is a diagram illustrating an input/output block including a tenth register having one register input according to an exemplary embodiment of the present inventive concept.

FIG. 7 is a diagram illustrating the input/output block 462 including the tenth register A10 having one register input according to an exemplary embodiment of the present inventive concept. For example, the input/output blocks 451 to 455, 458, 460, and 461 including registers A1 to A6, A8, and A9, each having one register input, may have the same structure as illustrated in FIG. 7.

Referring to FIGS. 6 and 7, the input/output block 462 includes an input driver 511, input logic 512, an output driver 513, output logic 514, a first multiplexer 515, a second multiplexer 516, and the register A10.

The input driver 511 and the output driver 513 may be connected with the data byte inversion bump DBI1 through the through silicon via 422. The input driver 511 may amplify a data byte inversion signal transmitted from the first data byte inversion bump DBI1 and may output the amplified signal to the input logic 512.

The input logic 512 may parallelize a signal from the input logic 512. For example, the input logic 512 may output a value synchronized at a falling edge of a write data strobe signal WDQS1 or WDQS2 as a falling data byte inversion signal DBI1_F. As an additional example, the input logic 512 may output a value synchronized at a rising edge of the write data strobe signal WDQS1 or WDQS2 as a rising data byte inversion signal DBI1_R.

The output logic 514 may receive the falling data byte inversion signal DBI1_F from the first multiplexer 515 and may receive the rising data byte inversion signal DBI1_R from the second multiplexer 516.

The output logic 514 may serialize the falling data byte inversion signal and the rising data byte inversion signal DBI1_R to values synchronized at a falling edge and a rising edge of a read data strobe signal RDQS1 or RDQS2. The output driver 513 may amplify a signal from the output logic 514 and may output the amplified signal to the first data byte inversion bump DBI1.

The falling data byte inversion signal DBI1_F and the rising data byte inversion signal DBI_R provided from the input logic 512 may be transmitted to a core "CORE" of the semiconductor memory device 400 and the register A10. For example, the core "CORE" may include memory cells which may store data and may be read to provide the stored data.

The tenth register A10 may include first to eighth elements 521 to 528. The first element 521 may receive a multi-input shift register (MISR) enable signal MISR_EN and a register input REG_IN. The register input REG_IN may be an output of, for example, the eighth register A8 of the loopback chain 480 of FIG. 6, and the output of the eighth register A8 may be a received input of the tenth register A10. The first element 521 may perform a NAND operation on the MISR enable signal MISR_EN and the register input REG_IN.

The second element 522 may receive the falling data byte inversion signal DBI1_F and an LFSR enable signal LFSR_EN. The second element 522 may perform a NAND operation on the falling data byte inversion signal DBI1_F and the LFSR enable signal LFSR_EN.

The third element 523 may perform a NOR operation on outputs of the first and second elements 521 and 522. The fourth element 524 may be a flip-flop which has an input "D" and an output "Q" and transfers an output of the third element 523 in synchronization with a clock signal CLK.

For example, an output of the fourth element 524 may be a falling signal, which is generated in the register A10 of the input/output block 462 corresponding to the data byte inversion bump DBI1 of the loopback chain 480, that is, a shift register falling data byte inversion signal SR_DBI_F.

The fifth element 525 may perform a NAND operation on the shift register falling data byte inversion signal SR_DBI_F and the MISR enable signal MISR_EN. The sixth element 526 may perform a NAND operation on the rising data byte inversion signal DBI1_R and the LFSR enable signal LFSR_EN.

The seventh element 527 may perform a NOR operation on outputs of the fifth and sixth elements 525 and 526. The eighth element 528 may be a flip-flop which has an input "D" and an output "Q" and transfers an output of the seventh element 527 in synchronization with the clock signal CLK.

For example, an output of the eighth element 528 may be a rising signal, which is generated in the register A10 of the input/output block 462 corresponding to the data byte inversion bump DBI1 of the loopback chain 480, that is for example, a shift register rising data byte inversion signal SR_DBI_R. In addition, the output of the eighth element 528 may be a register output REG_OUT. The register output REG_OUT may be connected with a next register A9 in the loopback chain 480.

When a selection signal SEL has a first value, the first multiplexer 515 may output the shift register falling data byte inversion signal SR_DBI_F as the falling data byte inversion signal DBI1_F. When the selection signal SEL has a second value, the first multiplexer 515 may output the falling data byte inversion signal DBI1_F output from the core "CORE".

When the selection signal SEL has the first value, the second multiplexer 516 may output the shill register rising data byte inversion signal SR_DBI_R as the rising data byte inversion signal DBI1_R. When the selection signal SEL has the second value, the second multiplexer 516 may output the rising data byte inversion signal DBI1_R output from the core "CORE".

In an exemplary embodiment of the present inventive concept, when the MISR enable signal MISR_EN and the LFSR enable signal LFSR_EN have the first value, the loopback chain 480 may operate as an MISR. When the MISR enable signal MISR_EN has the second value and the LFSR enable signal LFSR. EN has the first value, the loopback chain 480 may operate as an LFSR.

Figure 8:
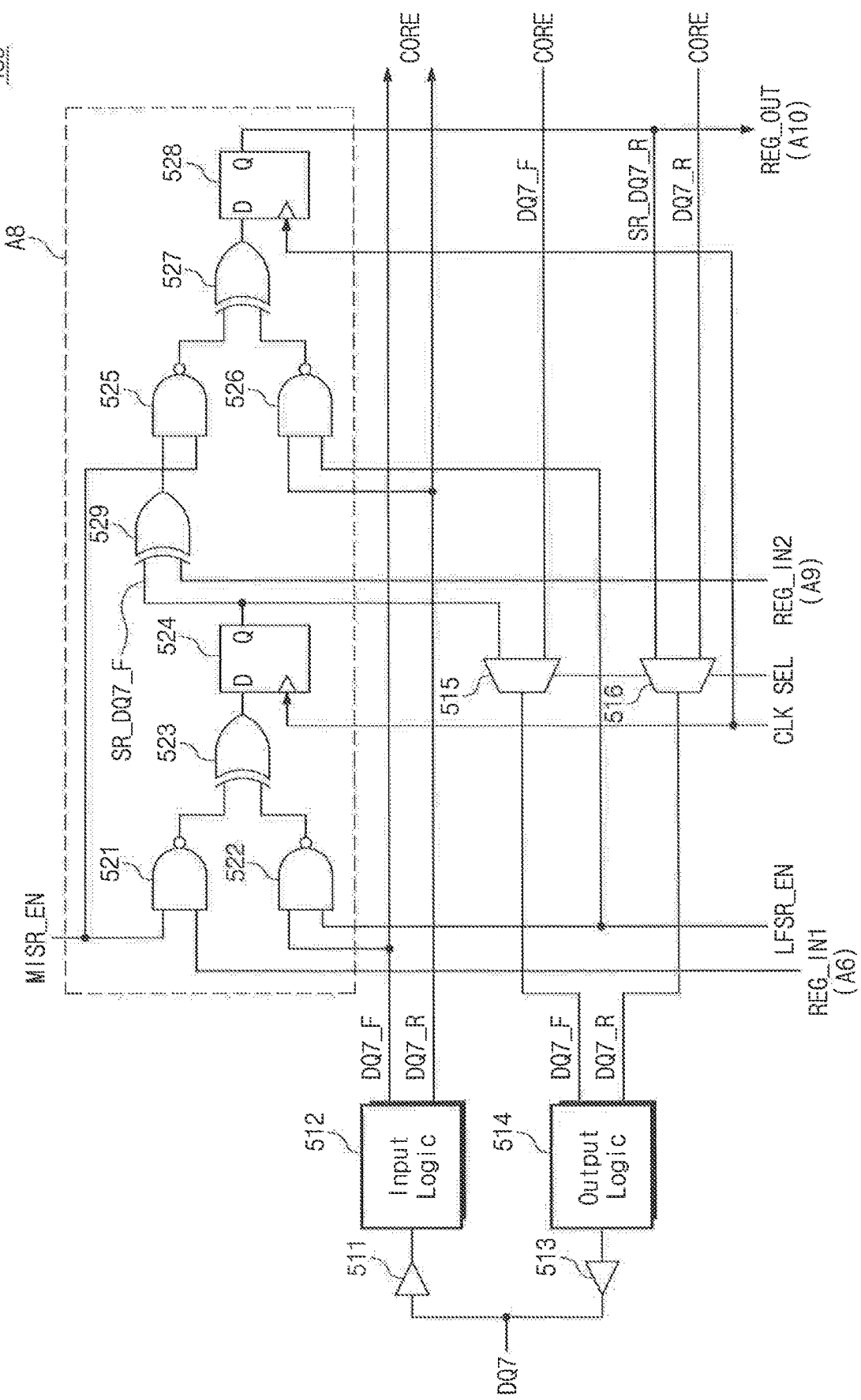
FIG. 8 is a diagram illustrating an input/output block including a seventh register having two register inputs according to an exemplary embodiment of the present inventive concept.

FIG. 8 is a diagram illustrating the input/output block. 459 including the eighth register A8 having two register inputs according to an exemplary embodiment of the present inventive concept. Referring to FIGS. 6 and 8, the input/output block 459 includes the input driver 511, the input logic 512, the output driver 513, the output logic 514, the first multiplexer 515, the second multiplexer 516, and the register A8.

In an exemplary embodiment of the present inventive concept, the input/output block 459 may be associated with the seventh data bump DQ7. For example, FIG. 8 is different from FIG. 7 because FIG. 8 refers to the seventh data bump DQ7 instead of the first data byte inversion bump DBI1 of FIG. 7. For example, a falling data signal DQ7_F, a rising data signal DQ7_R, a shift register falling data signal SR_DQ7_F, and a shift register rising data signal SR_DQ7_R may be used in FIG. 8.

The register A8 may include first to ninth elements 521 to 529. Compared to the register A10 of FIG. 7, the first element 521 may perform a NAND operation on the MISR enable signal MISR_EN and a first register input REG_IN1.

The first register input REG_IN1 may be an input transmitted through a main path of a shift register in the loopback chain 480. For example, a path for sequentially connecting the sixth register A6, the eighth register A8, and the tenth register A10 may be a main path of the loopback chain 480. An output of the sixth register A6 may be provided as the first register input REG_IN1.

Compared with the register A10 of FIG. 7, the register A8 further includes the ninth element 529. The ninth element 529 may perform a NOR operation on a shift register falling data signal SR_DQ7_F and a second register input REG_IN2.

The second register input REG_IN2 may be an input transmitted through an additional path. Which is included in the loopback chain 480 for an additional function associated with a linear feedback or multiple inputs, in addition to the main path of the shift register in the loopback chain 480.

For example, the path for sequentially connecting the sixth register A6, the eighth register A8, and the tenth register M0 may be a main path of the loopback chain 480. For example, the path for sequentially connecting the ninth register A9 and the eighth register A8 may be the additional path of the loopback chain 480. Accordingly, an output of the ninth register A9 may be provided as the second register input REG_IN2 to the eighth register A8.

Compared to the register A10 of FIG. 7, the fifth element 525 may perform a NAND operation on an output of the ninth element 529 and the MISR enable signal MISR_EN. An output of the eighth element 528 may be provided to the tenth register A10 as the register output REG_OUT. The remaining elements other than the above-described elements may have the same structure and connection as described with reference to FIG. 7. Thus, additional description will be omitted to avoid redundancy.

Figure 9:
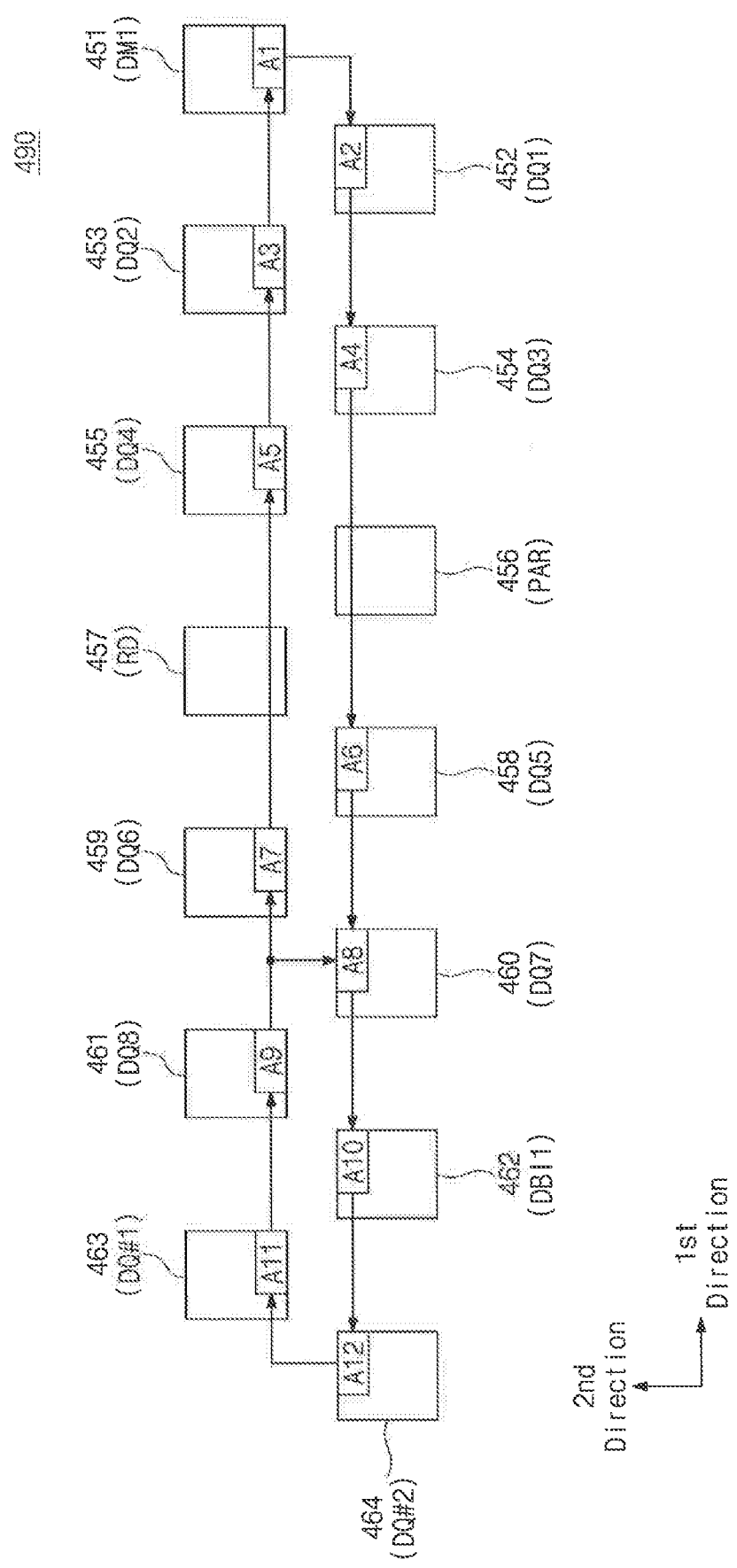
FIG. 9 is a diagram illustrating a loopback chain according to a loopback chain of FIG. 6 according to an exemplary embodiment of the present inventive concept.

FIG. 9 is a diagram illustrating a loopback chain 490 according to the loopback chain 480 of FIG. 6 according to an exemplary embodiment of the present inventive concept. Referring to FIG. 9, input/output blocks 451, 453, 455, 457, 459, 461, and 463 in the first row and the input/output blocks 452, 454, 456, 458, 460, 462, and 464 in the second row may be alternately arranged along the first direction.

Compared to FIG. 6, a data input/output block 463 associated with a first data inversion bump DQ #1 and a data input/output block 464 associated with a second data inversion bump DQ #2 may be added to the first row. The data input/output block 463 may include an eleventh register A11, and the data input/output block 464 may include a twelfth register A12.

Compared to FIG. 6 an output of the tenth register A10 may be connected with an input of the twelfth register A12. An output of the twelfth register A12 may be connected with an input of the eleventh register A11. An output of the eleventh register A11 may be connected with an input of the ninth register A9.

FIG. 10 is a diagram illustrating an arrangement of bumps associated with the address word (CH1_AW) 215 of a first channel according to an exemplary embodiment of the present inventive concept. Referring to FIG. 10, bumps of the address word (CH1_AW) 215 of the first channel may include an address group 350, power bumps VDD, and ground bumps VSS.

The address group 350 may include first to fourth rows of bumps. Bumps in the first row include an 8th column address bump C8, a 6th column address bump C6, a clock enable bump CKE, a 4th column address bump C4, a second column address bump C2, and a reserved bump ARFU along the first direction.

Bumps in the second row include a redundant column bump RC, a 7th column address bump C7, a fifth column address bump C5, a reserved bump ARFU, a 3rd column address bump C3, and a 1st column address bump C1 along the first direction.

Bumps in the third row include a reserved bump ARFU, a 6th row address bump R6, a 1st clock bump CK1, a 4th row address bump R4, a 2nd row address bump R2, and reserved bump ARFU along the first direction.

Bumps in the fourth row include an address error bump AERR, a redundant row bump RR, a 5th row address bump R5, a 2nd clock bump CK2, a 3rd row address bump R3, and a 1st row address bump R1 along the first direction.

The 1st to 8th column address bumps C1 to C8 may be used to convey (e.g., output) column address signals. The 1st to 6th row address bumps R1 to R6 may be used to convey row address signals. The redundant column hump RC may be used to convey a redundant column address signal.

The redundant row bump RR may be used to convey a redundant row address signal. The 1st and 2nd clock bumps CK1 and CK2 may be used to convey first and second clock signals which are used to receive address signals and are complementary.

The address error bump AERR may be used to convey an address error signal indicating that an error has occurred in an address signal. The reserved bumps ARFU may not be used or may be used to convey any other signal except for signals mentioned in the detailed description, or to convey an additional signal.

The bumps in the first row and the bumps in the second row may be alternately arranged along the first direction. For example, the redundant column bump RC in the second row may be positioned along the first direction, and the 8th column address bump C8 in the first row may be positioned along the first direction. For example, in the arrangement along the first direction, the redundant column bump RC in the second row is misaligned with the 8th column address hump C8 in the first row, and the 7$^{th}$ column address bump C7 in the second row is misaligned with the 8th column address bump C8 and the 6th column address bump C6 in the first row.

The 7th column address bump C7 in the second row may be positioned along the first direction, and the 6th column address bump C6 in the first row may be positioned along the first direction. Likewise, the remaining bumps in the first row and the remaining bumps in the second row may be alternately arranged along the first direction.

Bumps in the third row and bumps in the fourth row may be alternately arranged along the first direction. For example, the address error bump AERR in the fourth row may be positioned along the first direction, and the reserved bump ARM in the third row may be positioned along the first direction. For example, the address error hump AERR in the fourth row may be misaligned with the reserved bump ARFU in the third row.

The redundant row bump RC in the fourth row may be positioned along the first direction, and the address bump R6 in the third row may be positioned along the first direction. Likewise, the remaining bumps in the third row and the remaining bumps in the fourth row may be alternately arranged along the first direction.

Positions of the bumps in the first row may be substantially identical to positions of the bumps in the third row. Positions of the bumps in the second row may be substantially identical to positions of the bumps in the fourth row.

FIG. 10 is a diagram illustrating physical positions at which bumps are positioned. For example, positions of humps illustrated in FIG. 10 indicate positions on a coordinate system, at which the bumps are positioned, in consideration of a two-dimensional (also called rectangular or orthogonal) coordinate system formed by the first direction and the second direction, when viewed from a position of the address word (CH1_AW) 215 in the first channel. In an exemplary embodiment of the present inventive concept, a semiconductor memory device may include bumps of an address word in each channel that may be positioned the same as illustrated in FIG. 10.

Figure 11:
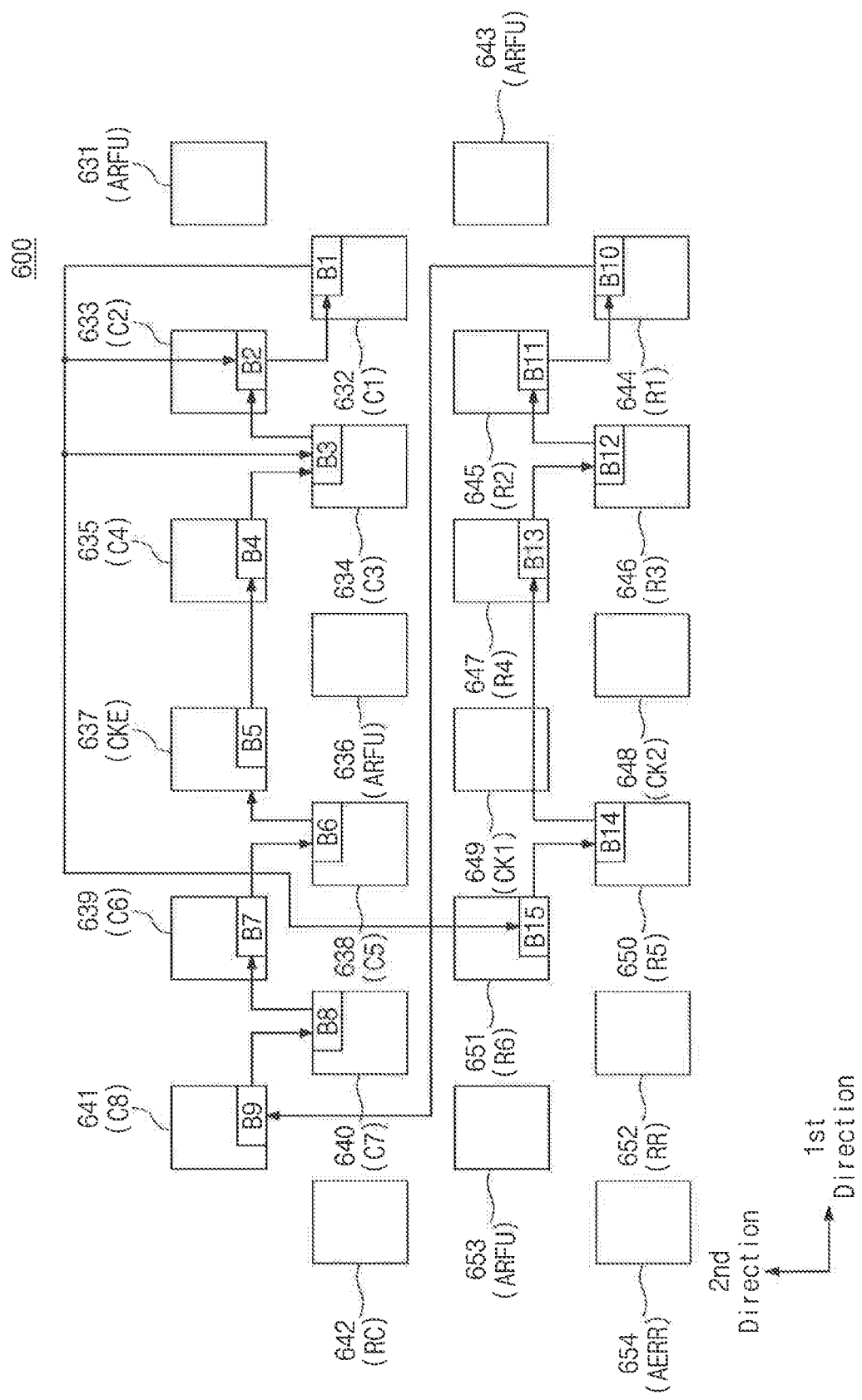
FIG. 11 is a diagram illustrating input/output blocks, associated with bumps of an address group of an address word in a first channel, forming a loopback chain according to an exemplary embodiment of the present inventive concept.

FIG. 11 is a diagram illustrating the input/output blocks 631 to 654, associated with the bumps C1 to C8, CKE, R1 to R6, RC, CK1, CK2, RR, AERR, and ARFU of the address group 350 of the address word (CH1_AW) 215 in the first channel, forming a loopback chain 600 according to an exemplary embodiment of the present inventive concept.

Referring to FIG. 11, the input/output blocks 631, 633, 635, 637, 639, and 641 in the first row and the input/output blocks 632, 634, 636, 638, 640, and 642 in the second row may be alternately arranged along the first direction. The input/output blocks 643, 645, 647, 649, 651, and 653 in the third row and the input/output blocks 644, 646, 648, 650, 652, and 654 in the fourth row may be alternately arranged along the first direction. In addition, the input/output blocks 632, 634, 636, 638, 640, and 642 in the second row and the input/output blocks 643, 645, 647, 649, 651, and 653 in the third row may be alternately arranged along the first direction.

In an exemplary embodiment of the present inventive concept, the input/output blocks 631, 636, and 643 corresponding to the reserved bumps ARFU may be omitted. In an exemplary embodiment of the present inventive concept, the input/output blocks 631, 636, and 643 corresponding to the reserved bumps ARFU, the input/output blocks 642 and 652 corresponding to the redundant column bump RC and the redundant row bump RR, the input/output blocks 648 and 649 corresponding to the 1st and 2nd clock bumps CK1 and CK2, and the input/output block 654 corresponding to the address error bump AERR may each not have a register for implementation of the loopback chain 600.

The input/output blocks 632, 633, 634, 635, 637, 638, 639, 640, and 641 respectively corresponding to the humps C1, C2, C3, C4, CKE, C5, C6, C7, and C8 may respectively include first to ninth registers B1 to B9.

The input/output blocks 644, 645, 646, 647, 650, and 651 respectively corresponding to the bumps R1, R2, R3, R4, R5, and R6 may respectively include tenth to fifteenth registers B10 to B15.

An output of the first register B1 may be connected with an input of the second register B2, an input of the third register B3, and an input of the fifteenth register B15. An output of the fifteenth register B15 may be connected with an input of the fourteenth register B14. An output of the fourteenth register B14 may be connected with an input of the thirteenth register B13.

An output of the thirteenth register B13 may be connected with an input of the twelfth register B12. An output of the twelfth register B12 may be connected with an input of the eleventh register B11. An output of the eleventh register B11 may be connected with an input of the tenth register B10. An output of the tenth register B10 may be connected with an input of the ninth register B9.

An output of the ninth register B9 may be connected with an input of the eighth register 138. An output of the eighth register B8 may be connected with an input of the seventh register B7. An output of the seventh register B7 may be connected with an input of the sixth register 136. An output of the sixth register 136 may be connected with an input of the fifth register B5.

An output of the fifth register B5 may be connected with an input of the fourth register B4. An output of the fourth register B4 may be connected with an input of the third register B3. An output of the third register B3 may be connected with an input of the second register B2. An output of the second register B2 may be connected with an input of the first register B1.

In the loopback chain 600 of FIG. 11, a length of a wiring connecting the output of the first register B1 and the input of the fifteenth register B15 and/or a length of a wiring connecting the output of the tenth register B10 and the input of the ninth register B9 may be longer than lengths of the remaining wirings. Accordingly, the wiring connecting the output of the first register B1 and the input of the fifteenth register B15 and/or the wiring connecting the output of the tenth register B10 and the input of the ninth register B9 may act as a critical path limiting the performance of the loopback chain 600.

Figure 12:
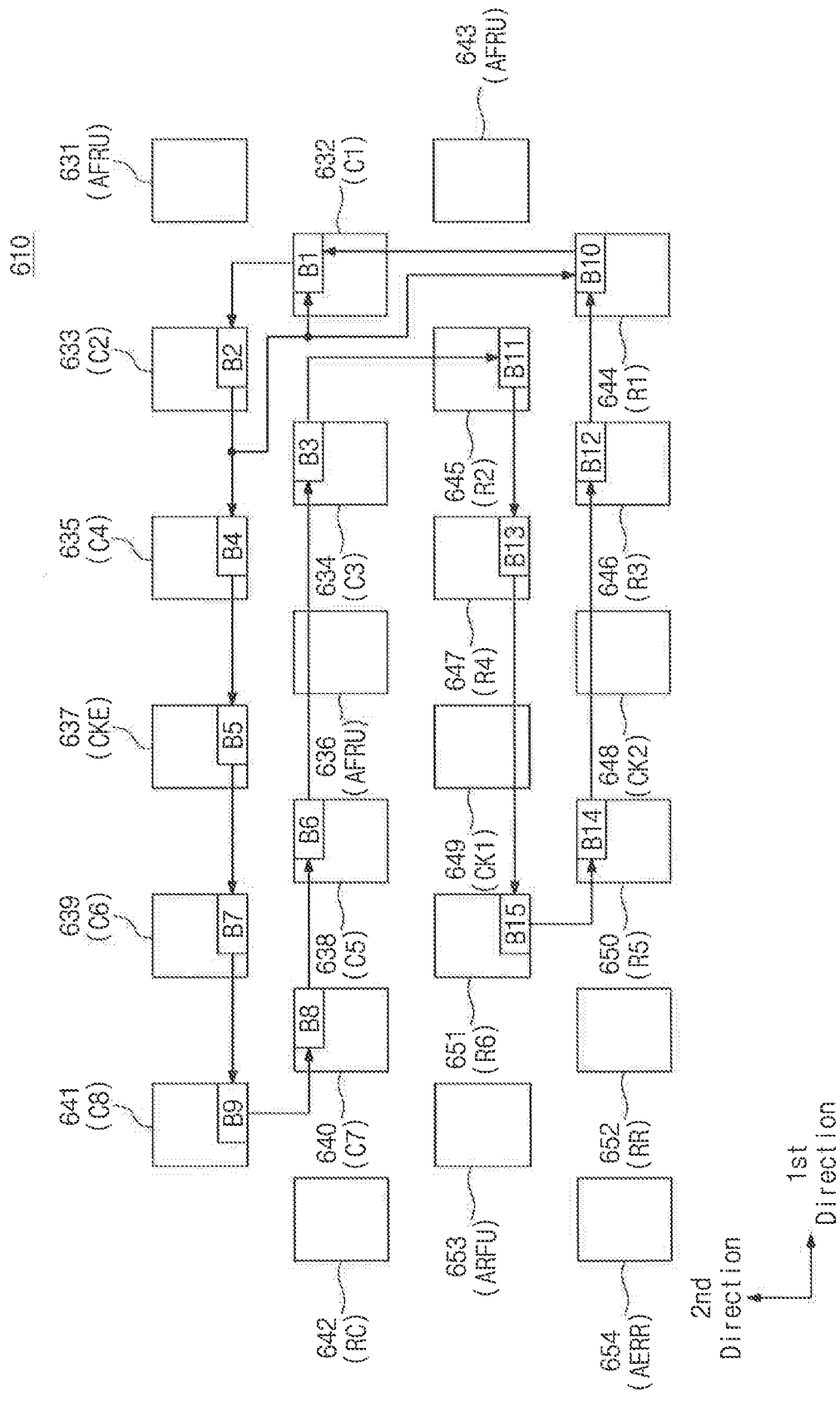
FIG. 12 is a diagram illustrating input/output blocks, associated with bumps of an address group of an address word in a first channel, forming a loopback chain according to an exemplary embodiment of the present inventive concept.

FIG. 12 is a diagram illustrating the input/output blocks 631 to 654, associated with the bumps C1 to C8, CKE, R1 to R6, RC, CK1, CK2, RR, AERR, and ARFU of the address group 350 of the address word (CH1_AW) 215 in the first channel, forming a loopback chain 610 according to an exemplary embodiment of the present inventive concept.

Referring to FIG. 12, the input/output blocks 631, 633, 635, 637, 639, and 641 in the first row and the input/output blocks 632, 634, 636, 638, 640, and 642 in the second row may be alternately arranged along the first direction. The input/output blocks 643, 645, 647, 649, 651, and 653 in the third row and the input/output blocks 644, 646, 648, 650, 652, and 654 in the fourth row may be alternately arranged along the first direction.

In an exemplary embodiment of the present inventive concept, the input/output blocks 631, 636, and 643 corresponding to the reserved bumps ARFU may be omitted. In an exemplary embodiment of the present inventive concept, the input/output blocks 631, 636, and 643 corresponding to the reserved bumps ARFU, the input/output blocks 642 and 652 corresponding to the redundant column bump RC and the redundant row bump RR, the input/output blocks 648 and 649 corresponding to the 1st and 2nd clock bumps CK1 and CK2, and the input/output block 654 corresponding to the address error bump AERR may each not have a register for implementation of the loopback chain 610.

The input/output blocks 632, 633, 634, 635 637, 638, 639, 640, and 641 respectively corresponding to the bumps C1, C2, C3, C4, CKE, C5, C6, C7, and C8 may respectively include first to ninth registers B1 to B9.

The input/output blocks 644, 645, 646, 647, 650, and 651 respectively corresponding to the bumps R1, R2, R3, R4, R5, and R6 may respectively include tenth to fifteenth registers B10 to B15.

An output of the first register B5 may be connected with an input of the second register 132. An output of the second register B2 may be connected with an input of the fourth register B4, an input of the first register B1, and an input of the tenth register B10. An output of the fourth register 134 may be connected with an input of the fifth register 135.

An output of the fifth register 135 may be connected with an input of the seventh register 137. An output of the seventh register B7 may be connected with an input of the ninth register B9. An output of the ninth register B9 may be connected with an input of the eighth register B8. An output of the eighth register B8 may be connected with an input of the sixth register B6. An output of the sixth register B6 may be connected with an input of the third register B3.

An output of the third register B3 may be connected with an input of the eleventh register B11. An output of the eleventh register B11 may be connected with an input of the thirteenth register B13. An output of the thirteenth register B13 may be connected with an input of the fifteenth register B15. An output of the fifteenth register 1315 may be connected with an input of the fourteenth register B14.

An output of the fourteenth register B14 may be connected with an input of the twelfth register B12. An output of the twelfth register B12 may be connected with an input of the tenth register B10. An output of the tenth register B10 may be connected with an input of the first register B1.

As illustrated in FIG. 12, an output of a certain register, which belongs to a specific column from among registers in the first to fourth rows may be connected with at least one of a first register, which is closest to the certain register, among the registers in the first row, a second register, which is closest the certain register, among the registers in the second row, a third register, which is closest to the certain register, among the registers in the third row, and a fourth register, which is closest to the certain register, among the registers in the fourth row.

In the case where the loopback chain 610 is formed as illustrated in FIG. 12, a critical path limiting the performance of the loopback chain 610 may be removed. Accordingly, the performance of the loopback chain 610 may be increased.

For example, registers, each of which has one input and one output, such as the second to ninth registers B2 to B9 and the eleventh to fifteenth registers B11 to B15, may have the same structure as the tenth registers A10 described with reference to FIG. 7. An input/output block including a register having one input and one output may have the same structure as described with reference to FIG. 7.

For example, an input/output block including a register having one input and one output may have a structure in which the output driver 513, the output logic 514, and the first and second multiplexers 515 and 516 may be removed from the structure of FIG. 7.

For example, registers, each of which has two inputs and one output, such as the first and tenth registers B1 and B10 may have the same structure as the eighth registers A8 described with reference to FIG. 8. An input/output block including a register having two inputs and one output may have the same structure as described with reference to FIG. 8.

For example, an input/output block including a register having two inputs and one output may have a structure in which the output driver 513, the output logic 514, and the first and second multiplexers 515 and 516 may be removed from the structure of FIG. 8.

In an exemplary embodiment of the present inventive concept, in FIG. 12, a path for connecting the first register B1, the second register B2, and the fourth register B4 may be a main path. A path for connecting the output of the second register B2 and the input of the first register B1 and a path for connecting the output of the second register B2 and the input of the tenth register 1310 may be additional paths.

As described with reference to FIG. 6, to apply the loopback chain 610 described with reference to FIG. 12, a training algorithm may be modified, or positions of bumps in the loopback chain 610 may be changed.

Figure 13:
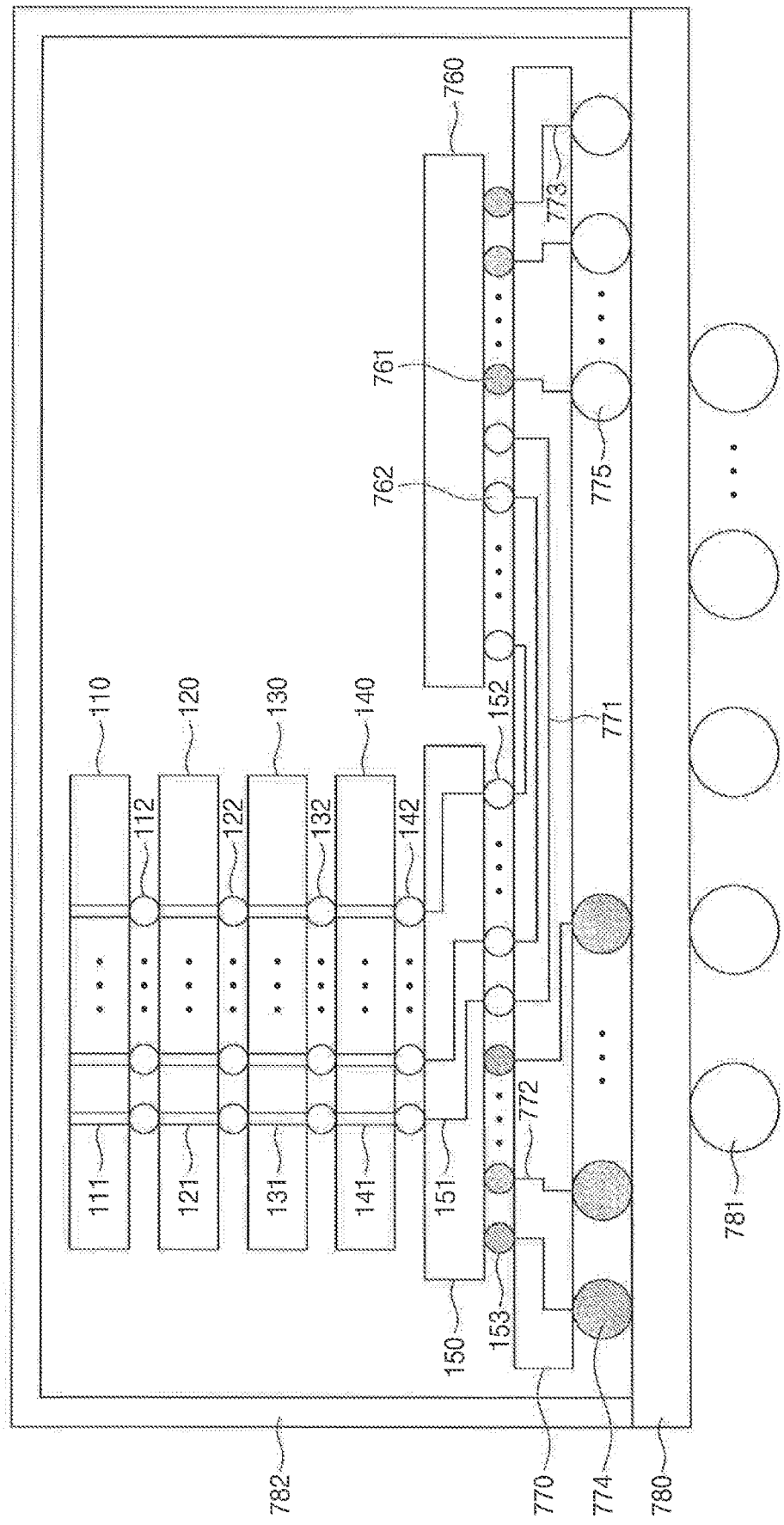
FIG. 13 is a diagram illustrating a semiconductor memory system according to an exemplary embodiment of the present inventive concept.

FIG. 13 is a diagram illustrating a semiconductor memory system 700 according to an exemplary embodiment of the present inventive concept. Referring to FIG. 13, the semiconductor memory system 700 includes the first to fourth semiconductor memory devices 110 to 140, the semiconductor logic device 150, a processing device 760, an interposer 770, and a package substrate 780.

The first to fourth semiconductor memory devices 110 to 140 and the semiconductor logic device 150 may be the same as those described with reference to FIG. 1. Thus, additional description may be omitted to avoid redundancy. The semiconductor logic device 150 may be connected to the interposer 770 through the fifth bumps 152 and the sixth bumps 153.

The processing device 760 may be connected to the interposer 770 through first processing bumps 761 and second processing bumps 762. The processing device 760 may include a central processing unit (CPU), a graphic processing unit (GPU), a system-on-chip, etc.

The semiconductor logic device 150 and the processing device 760 may be stacked on the interposer 770. The interposer 770 may be stacked on the package substrate 780. The interposer 770 may be connected to the package substrate 780 through first interposer bumps 774 and second interposer bumps 775.

The interposer 770 may connect the fifth bumps 152 of the semiconductor logic device 150 with the second processing bumps 762 of the processing device 760 through first internal wirings 771. The interposer 770 may connect the sixth bumps 153 of the semiconductor logic device 150 with the first interposer bumps 774 through second internal wirings 772. The interposer 770 may connect the first processing bumps 761 of the processing device 760 with the second interposer bumps 775 through third internal wirings 773.

The substrate 780 may be connected with an external device through substrate bumps 781. The substrate 780 may connect the first interposer bumps 774 and the second interposer bumps 775 with the substrate bumps 781 through internal wirings. A housing 782 surrounding the first to fourth semiconductor memory devices 110 to 140, the semiconductor logic device 150, the processing device 760, and the interposer 770 may be formed on the substrate 780.

In the above-described exemplary embodiments of the present inventive concept, the present inventive concept is described with reference to an example of a high bandwidth memory (HBM). However, the present inventive concept is not limited thereto. The present inventive concept may be applied to any memory which forms a loopback chain by connecting distributed registers depending on positions of bumps.

In the above-described embodiments, components according to exemplary embodiments of the present inventive concept are referred to by using the term "block". The "block" may be implemented with various hardware devices, such as an integrated circuit (IC), an application specific IC (ASIC), a field programmable gate array (FPGA), and a complex programmable logic device (CPU)), software, such as firmware and applications driven in hardware devices, and/or a combination of a hardware device and software. In addition, "block" may include circuits implemented with semiconductor devices.

According to the present inventive concept, lengths of wirings connecting registers constituting a shift register may decrease. Accordingly, a semiconductor memory device which may prevent malfunctions due to the high speed and low power is provided by reducing a time taken for internal voltages to reach target levels. In addition, a semiconductor memory device which may prevent malfunctions due to the high integration is provided by reducing an amount of coupling.

While the present inventive concept has been shown and described with reference to exemplary embodiments thereof, it will be apparent to those of ordinary skill in the art that various changes in form and detail may be made thereto without departing from the spirit and scope of the inventive concept as set forth in the following claims.

What is claimed is:

1. A semiconductor memory device comprising:
   first bumps positioned along a first direction;
   second bumps positioned in parallel to the first bumps along the first direction;
   first registers connected with the first bumps; and
   second registers connected with the second bumps,
      wherein the first registers and the second registers are sequentially connected and form a shift register,
   wherein an output of a third resister is connected with an input of a fourth register, wherein the third register is positioned at a last position, in the first direction, from among the first registers, and the fourth register is positioned at a last position, in the first direction, from among the second registers.

2. The semiconductor memory device of claim 1, wherein the first registers are sequentially connected to each other along the first direction.

3. The semiconductor memory device of claim 1, wherein the second registers are sequentially connected to each other along a direction opposite to the first direction.

4. The semiconductor memory device of claim 1, wherein an output of a sixth register is connected with an input of fifth register, wherein the sixth register is positioned at a last position, in a direction opposite to the first direction, from among the second registers, and the fifth register is positioned at a last position, in the direction opposite to the first direction, from among the first registers.

5. The semiconductor memory device of claim 1, wherein, in a first operation mode, the first registers and the second registers are configured to operate as a linear feedback shift register and to generate a pseudo random pattern.

6. The semiconductor memory device of claim 5, wherein the pseudo random pattern is output to an external device through the first bumps and the second bumps.

7. The semiconductor memory device of claim 1, wherein, in a second operation mode, the first registers and the second registers are configured to operate as a multiple input shifter register and to process an input pattern.

8. The semiconductor memory device of claim 7, wherein the input pattern is received from an external device through the first bumps and the second bumps.

9. The semiconductor memory device of claim 1, further comprising:
   a memory core including memory cells,
      wherein data received through the first bumps and the second bumps are transmitted to the first registers, the second registers, and the memory core.

10. The semiconductor memory device of claim 9, further comprising: a multiplexer configured to transmit first data from the memory core or second data from the first registers and the second registers, to the first bumps and the second bumps.

11. A semiconductor memory device comprising:
   first bumps positioned along a first direction;
   second bumps positioned in parallel to the first bumps along the first direction;
   first registers connected with the first bumps; and
   second registers connected with the second bumps,
      wherein an output of a certain register of the first registers and the second registers is connected with an input of one of a first register of the first registers and a second register, wherein the first register is the closest to the certain register, from among the first registers, and the second register is the closest to the certain register, from among the second registers, and
      wherein the first registers and the second registers form a shift register.

12. The semiconductor memory device of claim 11, wherein the first bumps and the second bumps are positioned on a bottom surface of the semiconductor memory device, wherein the first registers and the second registers are positioned at an interior of the semiconductor memory device, and wherein positions of the first registers and the second registers are associated with positions of the first bumps and the second bumps, respectively, that are on the bottom surface.

13. The semiconductor memory device of claim 11, wherein the first bumps are respectively connected with the first registers through first through silicon vias, and wherein the second bumps are respectively connected with the second registers through second through silicon vias.

14. The semiconductor memory device of claim 13, wherein the first registers are positioned adjacent to the first through silicon vias, and wherein the second registers are positioned adjacent to the second through silicon vias.

15. The semiconductor memory device of claim 11, wherein the first bumps and the second bumps correspond to some data words in compliance with a standard of a high bandwidth memory (HBM).

16. A semiconductor memory device comprising:
first bumps positioned along a first direction;
second bumps positioned in parallel to the first bumps along the first direction;
third bumps positioned in parallel to the second bumps along the first direction;
fourth bumps positioned in parallel to the third bumps along the first direction;
first registers connected with the first bumps;
second registers connected with the second bumps;
third registers connected with the third bumps; and
fourth registers connected with the fourth bumps, wherein an output of a certain register from among each of the first registers, the second registers, the third registers, and the fourth registers is connected with an input of one of a first register of the first registers, a second register of the second registers, a third register of the third registers, and a fourth register of the fourth registers, wherein the first register is the closest to the certain register, from among the first registers, wherein the second register is the closest to the certain register, from among the second registers, wherein the third register is the closest to the certain register, from among the third registers, wherein the fourth register is the closest to the certain register, from among the fourth registers, and wherein the first registers, the second registers, the third registers, and the fourth registers form a shift register.

17. The semiconductor memory device of claim 16, wherein the first registers are sequentially connected along a direction opposite to the first direction, wherein the second registers, other than a first-second register positioned at a last position in the first direction, are sequentially connected along the first direction, wherein the third registers are sequentially connected along the direction opposite to the first direction, and wherein the fourth registers are sequentially connected along the first direction.

18. The semiconductor memory device of claim 17, wherein an output of a first-first register is connected with an input of a second-second register, wherein the first-first register is positioned at a first position, in the first direction, from among the first registers, and the second-second register is positioned at a first position, in the first direction, from among the second registers, and wherein an output of a third-second register is connected with an input of a first-third register, wherein the third-second register is positioned at a second position, in the first direction, from among the second registers, and the first-third register is positioned at a last position, in the first direction, from among the third registers.

19. The semiconductor memory device of claim 17, wherein an output of a first-fourth register is connected with an input of the first-second register positioned at the last position in the first direction, from among the second registers, wherein the first-fourth register is positioned at a last position, in the first direction, from among the fourth registers, and wherein an output of the first-second register positioned at the last position is connected with an input of a second-first register, wherein the second-first register is positioned at a last position, in the first direction, from among the first registers.

* * * * *